US006826066B2

(12) United States Patent
Kozaru

(10) Patent No.: US 6,826,066 B2
(45) Date of Patent: Nov. 30, 2004

(54) SEMICONDUCTOR MEMORY MODULE

(75) Inventor: Kunihiko Kozaru, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/341,358

(22) Filed: Jan. 14, 2003

(65) Prior Publication Data
US 2004/0012991 A1 Jan. 22, 2004

(30) Foreign Application Priority Data

Jul. 18, 2002 (JP) ........................................ 2002-209612

(51) Int. Cl.⁷ ............................................... G11C 5/02
(52) U.S. Cl. ..................... 365/52; 365/201; 365/189.09
(58) Field of Search ..................... 365/52, 201, 189.09, 365/226

(56) References Cited

U.S. PATENT DOCUMENTS 6,272,034 B1 * 8/2001 Kinoshita et al. ............. 365/52
6,535,422 B2 * 3/2003 Goto et al. .................... 365/52
2004/0027153 A1 * 2/2004 Satou et al. ................... 326/30

FOREIGN PATENT DOCUMENTS

| JP | 11-162194 | 6/1999 |
| JP | P2001-229697 A | 8/2001 |

* cited by examiner

Primary Examiner—Huan Hoang
(74) Attorney, Agent, or Firm—McDermott Will & Emery LLP

(57) ABSTRACT

A substrate pad VREFT provided outside of the mold resin and word line driving voltage generation circuits within a plurality of bare chips are electrically connected only through electrical wires on a module substrate. Therefore, it becomes possible to force a voltage to the word line driving voltage generation circuits from the outside not only after the plurality of bare chips is mounted on the module substrate but also after the plurality of bare chips is integrally covered with mold resin by applying a desired voltage to the substrate pad VREFT. There is provided a semiconductor memory module capable of performing a test for a semiconductor chip after the semiconductor chip is mounted on a module substrate.

4 Claims, 27 Drawing Sheets

SEMICONDUCTOR MEMORY MODULE

BACKGROUND OF THE INVENTION

1. Field of the Invention

The present invention relates to a semiconductor memory module wherein semiconductor chips are mounted on a module substrate.

2. Description of the Background Art

A semiconductor memory device is, in many cases, utilized in a personal computer, a workstation or the like. In addition, in recent personal computers speed has been increased, density has been increased and performance has been enhanced and, therefore, further increase in memory capacity of semiconductor memory modules is required. In addition, there is an expanding market demand for low cost memories. Therefore, a further increase in the capacity of, and a lowering in the cost of, semiconductor memory devices have come to be required.

The amount of utilization of DRAMs (Dynamic Random Access Memories) for personal computers and the like has increased from among the above described semiconductor memory devices because of the advantage from the point of view of cost per unit bit. Even in the case that the capacity of a DRAM is increased, the cost per unit bit can be reduced by increasing the diameter of wafer for DRAMs. Therefore, DRAMs are frequency utilized.

Even in the case of a DRAM, however, the test period of time and test cost accompanying the increase in capacity have increased and the development costs accompanying improvements in microscope processing technology and costs for increasingly sophisticated facilities have greatly increased and, therefore, the question arises of whether or not these costs can be reduced.

In general, there are three types of bit configurations, four bit, eight bit and sixteen bit, of the input/output of a DRAM, so that the number of types of bit configurations is small. Therefore, in general, one module made up of a plurality of DRAMs is utilized. Semiconductor memory devices such as DRAMs are, in many cases, utilized in module conditions, as described above.

FIGS. 25 and 26 show an example of a semiconductor memory module according to a prior art. The semiconductor memory module according to a prior art has a structure wherein a single chip 117 having a bare chip 101, a die pad 104, bonding wires 105 and a lead frame 110 sealed in mold resin 108 is mounted on a module substrate 102, such as of an SOP (Small Outline Package) and of a TSOP (Thin Small Outline Package), corresponding to a surface mounting technology wherein parts can be mounted on both surfaces of a printed circuit board. In addition, data input/output terminals DQ0 to DQ63, for inputting/outputting signals connected to lead frames 110 of single chips 117, are provided on module substrate 102.

In addition, a basic trend of developing thinner and more miniaturized memory packages has been progressing, together with the enhancement of performance and functions of memory chips. Thus, package modes have greatly changed such that in addition to the insertion system that has been previously adopted for memory packages, in recent years a surface mounting system has been adopted.

At present, the surface mounting system has become the main trend, as opposed to the insertion system, and further reduction in size and in weight of packages is greatly required. Simplification of design, increase in reliability and reduction in cost has been achieved up to the present by utilizing semiconductor memory modules.

In addition, in the case that a defective chip is discovered in a module test after the manufacture of a semiconductor memory module, testing and replacement of defective chips are repeatedly carried out until defects are no longer found in the manufacturing process of a semiconductor memory module according to a prior art.

In general, a DRAM is provided with an internal voltage generation circuit for generating a predetermined internal voltage utilizing a power supply voltage VDD supplied from the outside. The internal voltage generation circuit is, for example, a word line driving voltage VPP generation circuit, a reference voltage VREFD generation circuit for a VPP generation circuit, a sense amplifier power supply voltage VDDS generation circuit within a memory array, a reference voltage VREFS generation circuit for a VDDS generation circuit, a cell plate voltage VCP generation circuit, a bit line voltage VBL generation circuit, a substrate bias voltage VBB generation circuit or the like.

A method is used for controlling the above described internal voltage generation circuit by converting a DRAM to a variety of test modes for a short period of time in order to detect whether or not the DRAM is defective for tests at the time of delivery of the DRAM. According to this method, it becomes possible for a DRAM to forcefully apply a predetermined voltage to an internal circuit. Here, a predetermined voltage is generated in an internal voltage generation circuit by applying a voltage to the internal voltage generation circuit from the outside. This predetermined voltage generated in the internal voltage generation circuit is applied to the internal circuit. Hereinafter the expression "a voltage is forced" is used to indicate "a voltage is forcefully applied to an internal circuit."

FIGS. 27 to 29 are diagrams for describing a semiconductor memory module according to a prior art, on which is mounted a synchronous DRAM (hereinafter referred to as "SDRAM"), which is an example of a single chip 117, that can be converted to a test mode before it is mounted on a module substrate 102 so that a voltage generated by an internal voltage generation circuit is controlled.

In the following, a method for controlling an internal voltage generated by an internal voltage generation circuit of an SDRAM, from the outside of the SDRAM, before the SDRAM is mounted on module substrate 102 is described in reference to FIGS. 27 to 29.

FIG. 27 is a diagram shown an enlarged view of one single chip 117 from among a plurality of single chips 117 in the semiconductor memory module shown in FIG. 25. Here, single chip 117 of FIG. 27 is shown as a schematic sketch so that the structure within mold resin 108 can be seen. In addition, a lead frame 110 is electrically connected to bonding pads 106 via bonding wires 105.

In addition, FIG. 28 is a diagram schematically showing the internal structure of a bare chip 101. A test mode detection circuit 150, shown in FIG. 28, generates a control signal for controlling an internal voltage generation circuit and an internal voltage force circuit. The two-stage procedure shown in the following is required in order to enter into individual test modes in order to control the internal voltages generated by a variety internal voltage generation circuits.

First, as a first stage shown in FIG. 29, commands inputted to a chip selection terminal/CS, a row address strobe terminal/RAS, a column address strobe terminal/CAS and a write enabling terminal/WE, provided in a single chip 117 as shown in FIG. 27, are converted to mode register set (hereinafter referred to as "MRS") commands, that is to say, /CS=L, /RAS=L, /CAS=L and /WE=L are attained. In addition, commands inputted to bank address selection signal input terminals BA0, BA1 and an address signal input terminal A7 are set at BA0=H, BA1=H and A7=H. Thereby, single chip 117 enters into a test mode.

After that, as a second stage, the above described MRS commands are again inputted to a chip selection terminal/CS provided in single chip 117, to row address strobe terminal/RAS, to column address strobe terminal/CAS and to write enabling terminal/WE. Thereby, individual test modes determined in accordance with the types of commands inputted to band address selection signal input terminals BA0 and BA1 as well as to address signal input terminals A0 to An are entered. Here, Table 1 shows types of commands for entering a variety of voltage force modes.

whereby a voltage generated by internal voltage force circuit 158 is forced into node VBB. Accordingly, a voltage generated by internal voltage generation circuits 155 and 158, respectively, to which nodes VPP, VDD, VCP, VBL and VBB, respectively, are connected, is forced into internal circuits 161 to 165 connected to the above nodes, respectively.

As shown in FIG. 27, however, the above described semiconductor memory module according to the prior art has a structure wherein bonding pads 106 provided on bare chip 101 and lead frame 110 are connected with bonding wires 105. In addition, in order to force internal voltages VCP, VBL, VBB, VPP, VDDS, VREFS and VREFD from the outside to internal circuits 161 to 165, the voltages are applied to bonding pads 106 provided on bare chip 101 shown in FIG. 27. In general, in wafer testing predetermined

TABLE 1

| TITLE OF TEST MODE | COMMAND | BA1 | BA0 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|
| VREFD FORCE MODE | MRS | L | H | — | — | — | — | — | H | L | H | L | H | H | H | H |
| VREFS FORCE MODE | MRS | L | H | — | — | — | — | — | H | L | H | L | H | H | L | H |
| VCP FORCE MODE | MRS | L | H | — | — | — | — | — | H | L | H | H | H | L | L | H |
| VBL FORCE MODE | MRS | L | H | — | — | — | — | — | H | L | H | H | L | H | L | L |
| VBB FORCE MODE | MRS | L | H | — | — | — | — | — | H | L | H | L | L | L | H | H |

Next, the operation of the circuit inside of bare chip 101 that has entered a predetermined test mode according to the procedure of the above described second stage is described in reference to FIG. 28. Signals outputted from a test mode detection circuit 150 in test modes include a test mode VREFD force indication signal TMREFDFRC indicating entry into a variety of test modes, a test mode VREFS force indication signal TMREFSFRC, a test mode VBB force indication signal TMVBBFRC, a test mode VCP force indication signal TMVCPFRC and a test mode VBL force indication signal TMVBLFRC.

A test mode VREFD force indication signal TMVREFDFRC, a test mode VREFS force indication signal TMREFSFRC, a test mode VCP force indication signal TMVCPFRC and a test mode VBL force indication signal TMVBLFRC are transmitted to an internal voltage force circuit 155. A test mode VBB force indication signal TMVBBFRC is transmitted to an internal voltage force circuit 158.

Furthermore, a test mode VREFD force indication signal TMVREFDFRC is transmitted to a reference voltage VREFD generation circuit 151. A test mode VREFS force indication signal TMVREFSFRC is transmitted to a reference voltage VREFS generation circuit 153. A test mode VBB force indication signal TMVBBFRC is transmitted to a substrate voltage VBB generation circuit 159. A test mode VCP force indication signal TMVCPFRC is transmitted to a cell plate voltage VCP generation circuit 156. A test mode VBL force indication signal TMVBLFRC is transmitted to a bit line voltage VBL generation circuit 157.

As shown in FIG. 28, a desired voltage is applied to a terminal DQM, whereby a voltage generated by internal voltage force circuit 155 is forced into a node VREFD, a node VREFS, a node VCP and a node VBL. On the other hand, a voltage is applied to chip selection terminal/CS, voltages are applied to bonding pads 106, whereby a variety of tests can be carried out on the internal circuits of bare chip 101.

These bonding pads 106, however, are not connected to lead frame 110 at the time of assembly. Therefore, voltages cannot be forced from the outside to internal circuits 161 to 165 after bare chip 101 has been covered with mold resin 108 so as to form single chip 117.

Accordingly, after the MRS commands have been inputted to test mode detection circuit 150 in order to enter into individual test modes, as described above, the internal voltages generated in internal voltage force circuits 155 and 158 are forced into internal circuits 161 to 165 by applying predetermined voltages to terminal DQM and to chip selection terminal/CS.

However, the following problems arise in the semiconductor memory module wherein a plurality of single chips 117 is mounted on mold substrate 102.

As described above a plurality of single chips 117 is mounted on module substrate 2 in the semiconductor memory module. In the case that a test is carried out on internal circuits 161 to 165 within single chips 117 after singles chips 117 have been mounted on this module substrate 2, a signal is inputted to terminal DQM provided on module substrate 2. As shown in FIG. 28, however, a buffer circuit 300 for the formation of an input waveform, in some cases, exists between terminal DQM of module substrate 102 and terminal DQM (chip) of a single chip 117 that becomes the test object.

In addition, control signals and address signals except for control signals inputted/outputted using data input/output terminals DQ0 to DQ71 of the module are all inputted via buffer circuit 300 in a product called registered DIMM of an SDRAM module. Accordingly, voltages generated by internal voltage force circuits 155 and 158 cannot be applied to internal circuits 161 to 165 of the SDRAM after converting a single 117 to a test mode by applying a predetermined voltage to terminal DQM or to chip selection terminal/CS after single chips 117 have been mounted on module substrate 2.

Furthermore, in the case that a system test is carried out on the semiconductor memory module under the condition wherein single chips 117 have been mounted on module substrate 102, the voltages applied to respective input terminals DQ0 to DQ63 of module substrate 102 shown in FIG. 25 are voltages specific to this system test. Therefore, a desired voltage cannot be applied to a specific input terminal of a single chip 117.

In addition, it is necessary to input predetermined commands, such as MRS commands, to a single chip 117 in order to enter into individual test modes. However, in many cases, it is extremely difficult to follow, under actual usage conditions, the predetermined procedure required for test mode entry according to the usage of a memory controller of the system.

Unless a test for detecting whether or not there is a defect among single chips 117 can be carried out after single chips 117 have been mounted on module substrate 102 as described above, the semiconductor memory module cannot be repaired according to a technique wherein a defective single chip 117 is detected so that defective single chip 117 is replaced with a repair chip that properly functions.

SUMMARY OF THE INVENTION

An object of the present invention is to provide a semiconductor memory module capable of performing a test for a semiconductor chip after the semiconductor chip is mounted on a module substrate.

A semiconductor memory module according to the present invention is a semiconductor memory module having a plurality of units of the same type as the following mounted on a module substrate. The unit has a semiconductor chip having an internal voltage generation circuit for internally generating a voltage utilized in an internal circuit, and a voltage application terminal, electrically connected to the internal circuit, for allowing a desired voltage to be applied to the internal circuit using a device for voltage application located outside of the plurality of semiconductor chips. In addition, the internal voltage generation circuit and the voltage application terminal are electrically connected by a conductive member.

According to the above described configuration, a variety of tests can be carried out by applying a desired voltage to the internal circuit after the semiconductor chips are mounted on the module substrate.

A semiconductor memory module according to another aspect of the present invention is a semiconductor memory module having a plurality of units of the same type as the following mounted on a module substrate.

The unit has an internal voltage generation circuit, provided inside of a semiconductor chip, for internally generating a voltage utilized in an internal circuit of this semiconductor chip, and a terminal for command input, provided outside of this semiconductor chip, to which a test mode command is inputted for indicating that a test is to be carried out on the semiconductor chips in the semiconductor memory module.

In addition, the unit has a test mode detection circuit, provided inside of the semiconductor chip, for outputting a test mode indication signal in the case that a test mode command is inputted to the command input terminal, and an internal voltage force circuit, provided inside of the semiconductor chip, for applying a voltage to the internal circuit when a test mode indication signal outputted by the test mode detection circuit is inputted.

According to the above described configuration, a variety of tests can be carried out by applying a voltage generated by the internal voltage force circuit to an internal circuit after the semiconductor chips are mounted on the module substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

First, a semiconductor memory module of the present embodiments that can be repaired after bare chips have been covered with mold resin is described in the following in reference to FIGS. 1 to 7.

In the case that a bare chip sealed in a mold is detected as being defective, a repair chip, which substitutes this bare chip, is mounted on a module substrate, whereby a semiconductor memory module of the present embodiments is repaired.

Figure 1:
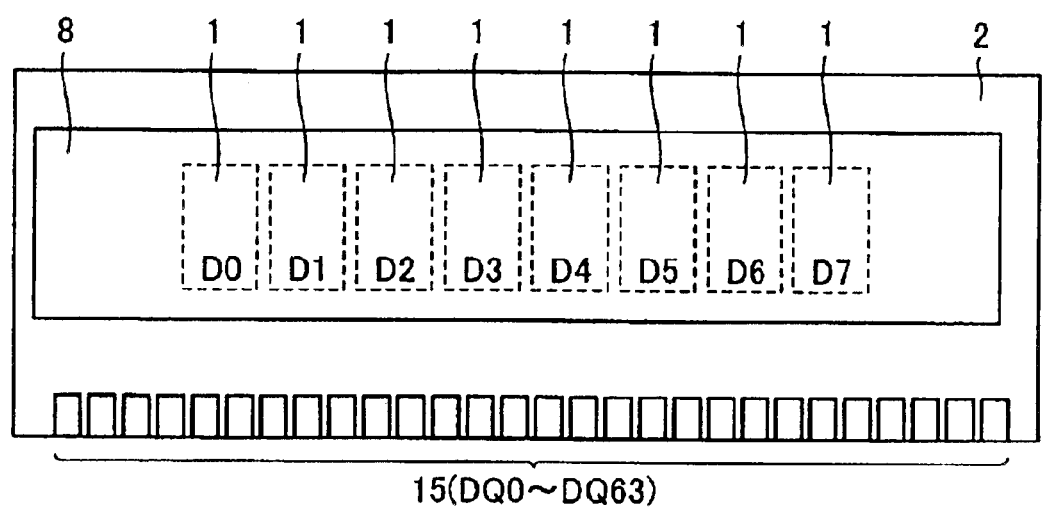
FIG. 1 is a diagram showing a condition wherein a plurality of bare chips mounted on a module substrate is integrally molded in mold resin in the semiconductor memory module of the embodiments.

FIG. 1 shows the semiconductor memory module of the embodiments. As shown in FIG. 1, a plurality of bare chips 1 is directly mounted on one of the main surfaces of a module substrate 2 and the plurality of bare chips 1 is integrally molded in mold resin 8 in the semiconductor memory module of the embodiments.

Figure 2:
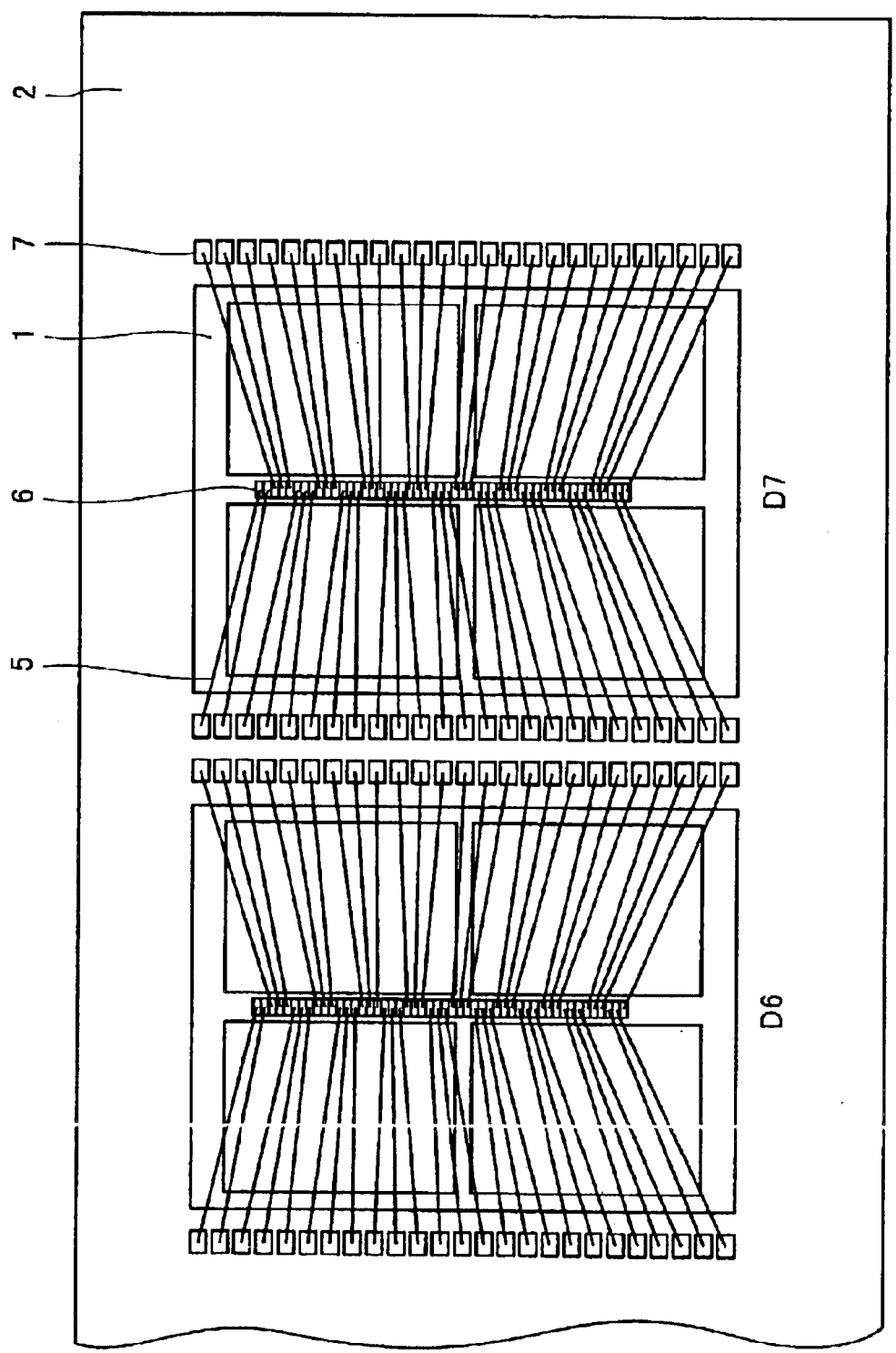
FIG. 2 is a diagram for describing bare chips mounted on the module substrate.

In addition, as shown in FIG. 2, chip pads 6 provided on a bare chip 1 and substrate pads 7 provided on module substrate 2 are connected to each other by means of bonding wires 5.

Figure 3:
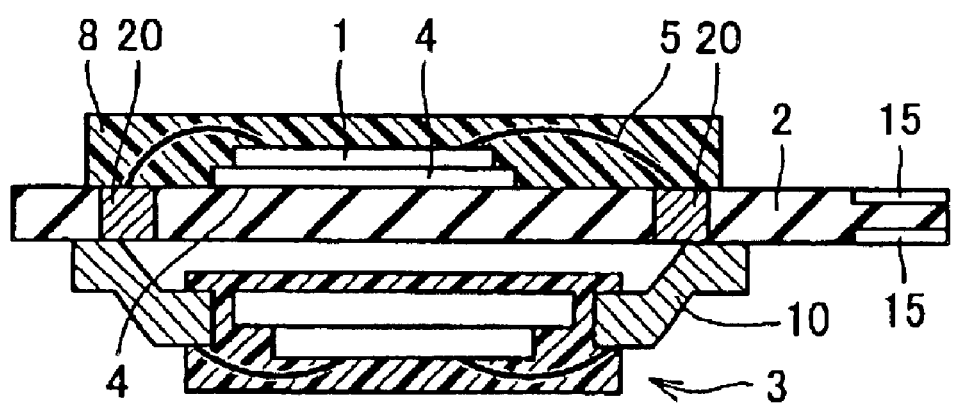
FIG. 3 is a diagram for describing a cross sectional structure of a bare chip and a repair chip mounted on the module substrate.

In addition, the semiconductor memory module of the embodiments has a structure wherein, in the case that any bare chip 1 from among the plurality of bare chips 1 is detected as being defective, a repair chip 3 used in place of bare chip 1 can be mounted on the rear side that is opposite to the main surface on which the plurality of bare chips 1 is provided, as shown in FIG. 3.

A bare chip 1 mounted on the front surface of the semiconductor memory module and a repair chip 3, which is a good chip, mounted on the rear surface so as to be used in place of this bare chip 1 utilize the common electrical wires. In addition, in the case that repair chip 3 is mounted on the rear surface of module substrate 2, electrical wires 20 therein are connected to both the plurality of bare chips 1 mounted on the front surface as well as to repair chip 3 mounted in one of a plurality of repair chip mounting regions on the rear surface, respectively, via through holes penetrating module substrate 2 as shown in FIG. 3.

According to a manufacturing method for a semiconductor memory module of the present embodiments, as shown in FIG. 2, chip pads 6 provided on a plurality of bare chips 1 and substrate pads 7 provided on a module substrate 2 are electrically connected to each other by means of bonding wires 5 after the plurality of bare chips 1 is mounted on module substrate 2.

After that, as shown in FIG. 3, the plurality of bare chips 1 is integrally molded in mold resin 8, whereby the semiconductor memory module is completed. Then, the structure thereof allows a repair chip 3 in a mold to be mounted, if necessary, on the rear surface of module substrate 2 after the completion of the semiconductor memory module.

Therefore, in the case that a defect is detected from among the plurality of bare chips 1 in a variety of tests, such as a system test, after the manufacture of a memory module, which is an example of a semiconductor memory module, a repair chip 3 is mounted on the rear surface of module substrate 2 so that repair chip 3 carries out the functions of bare chip 1, which has become defective, whereby it becomes possible to repair the semiconductor memory module.

Here, it is necessary to turn off the operations of bare chip 1 that has been detected as being defective in order for repair chip 3 to carry out the functions of bare chip 1 that has been detected as being defective. In order to achieve this, it becomes necessary to control bare chip 1 so as to be switched between the condition wherein it functions and the condition wherein it does not function.

In a module substrate of the present embodiments, a signal at a predetermined potential is inputted to a terminal, which is not utilized at the time of actual usage, whereby the input/output of a bare chip 1 that has been mounted on module substrate 2 is controlled so as to be switched between on and off so that repair chip 3 carries out the functions of bare chip 1 that has been detected as being defective.

Here, a semiconductor memory module of the embodiments is integrally molded in mold resin 8 after the plurality of bare chips 1 has been mounted on module substrate 2 and chip pads 6 of bare chips 1 and substrate pad 7 of module substrate 2 have been electrically connected. Therefore, the mounting area of the semiconductor memory module can be reduced.

Figure 4:
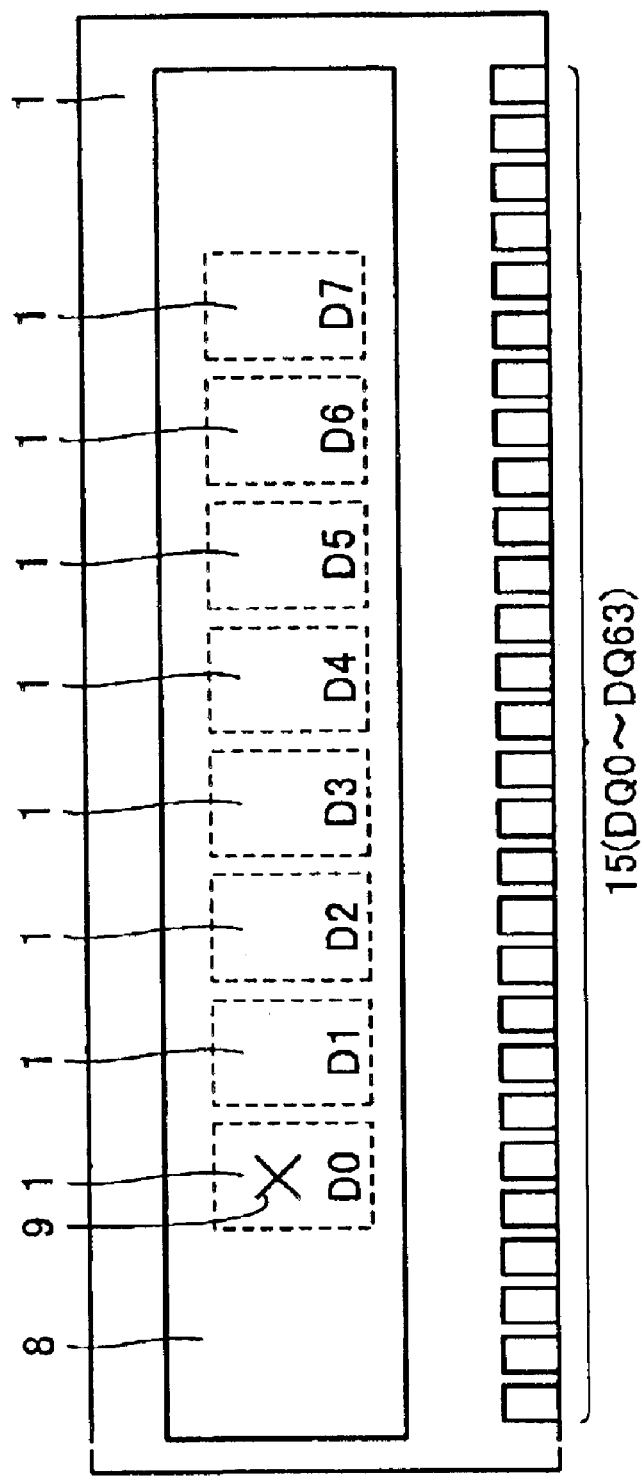
FIG. 4 is a diagram for describing that one of the bare chips mounted on the module substrate has become defective.
Figure 5:
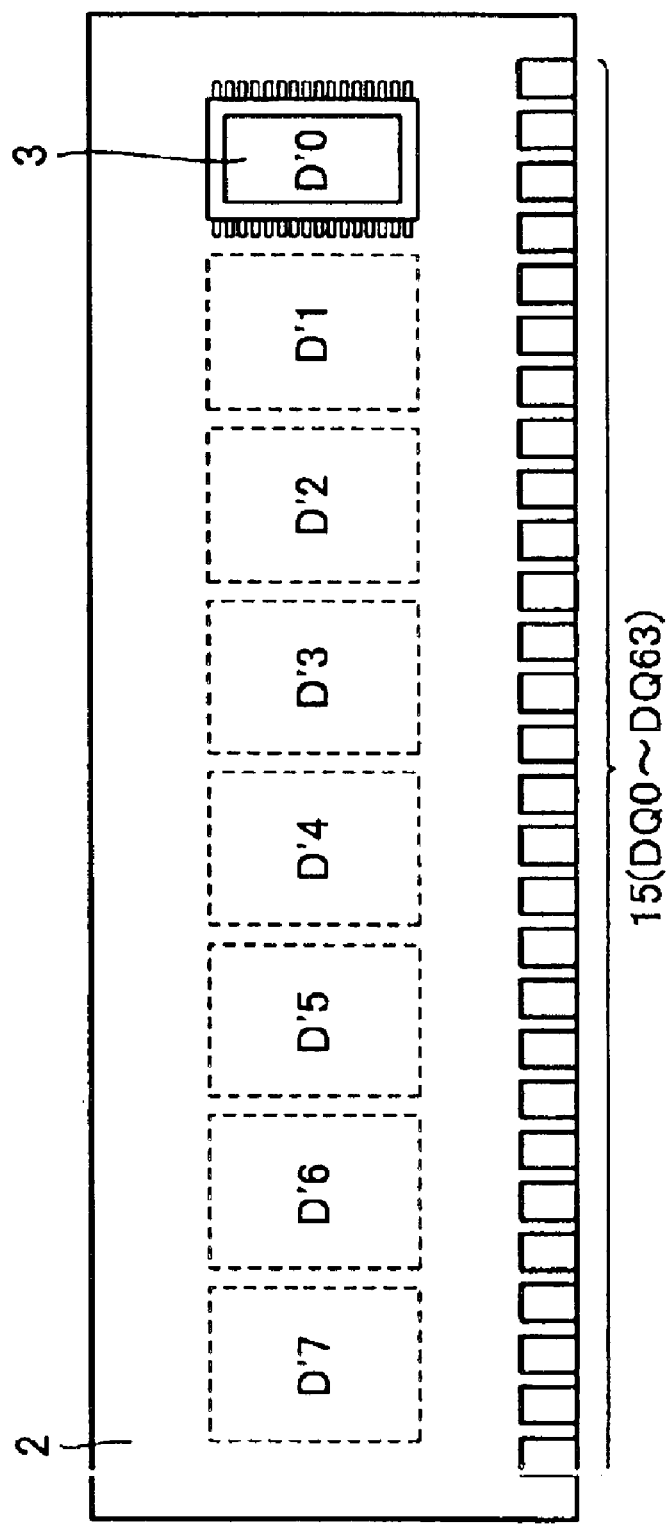
FIG. 5 is a diagram for describing that a repair chip mounted on the rear surface of the module substrate is utilized so as to repair the semiconductor memory module.

FIGS. 4 and 5 show a configuration example of a module substrate after repair. As shown in FIGS. 4 and 5, in the semiconductor memory module, bare chips 1 (D0 to D7) are mounted on the front surface of module substrate 2 and repair chip mounting regions for repair chips 3 (D'0 to D'7), which are mounted at the time of repair, are provided on the rear surface of module substrate 2.

Figure 6:
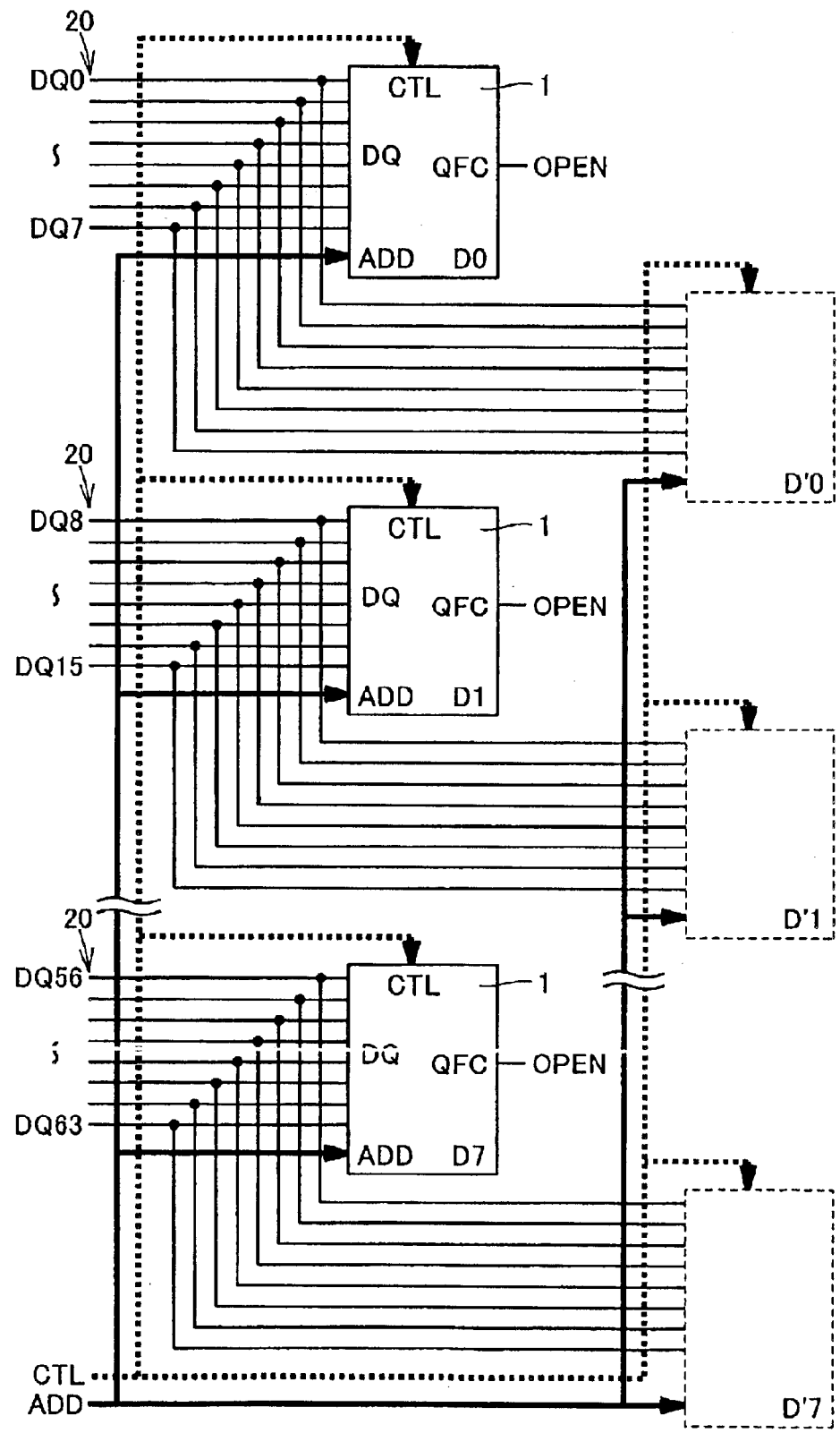
FIG. 6 is a diagram for describing the configuration of a module substrate before repair.

FIG. 6 shows a block diagram of the front surface of module substrate 2, on which bare chips 1 (D0 to D7) have been mounted before repair. As shown in FIG. 6, bare chips 1 (D0 to D7) are provided with QFC pins (not limited solely to QFC pins in the case that the terminals are not normally utilized) for controlling the input/output of a bare chip 1 that has been detected as being defective.

Figure 7:
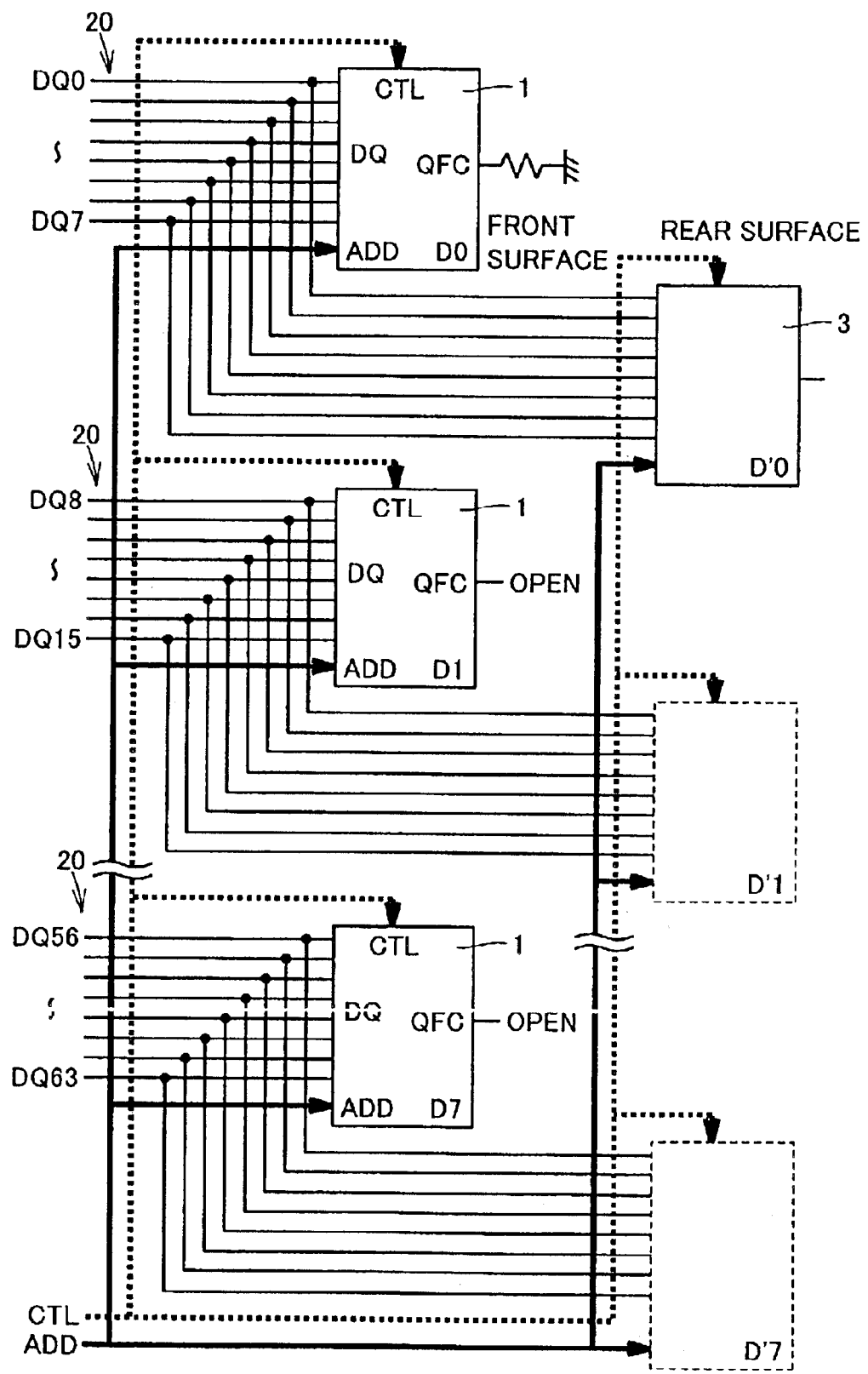
FIG. 7 is a diagram for describing the configuration of a module substrate after repair.

FIG. 7 shows a block diagram of the front surface and of the rear surface of module substrate 2, on which a single repair chip 3 (D'0 to D'7) in a mold has been mounted so as to be utilized after repair. Here, bare chips 1 (D0 to D7) and repair chips 3 (D'0 to D'7), respectively, utilize data input/output terminals DQ0 to DQ63 connected to the same electrical wires 20. Here, date input/output terminals DQ0 to DQ63 are terminals that are connected to other circuits or memories for inputting/outputting electrical signals to/from these other circuits or memories.

Though a problem does not arise in the semiconductor memory module configuration before repair shown in FIG. 6, wherein repair chips 3 are not mounted, in the configuration of the semiconductor memory module after repair shown in FIG. 7, bare chip 1 (D0) and repair chip 3 (D'0) utilize data input/output terminals DQ0 to DQ63 connected to the same electrical wires 20 and, therefore, a problem arises under the condition wherein bare chip 1 (D0) and repair chip 3 (D'0) both operate so that the respective input/output signals of bare chip 1 (D0) and repair chip 3 (D'0) collide with each other.

Therefore, in a semiconductor memory module of the embodiments, the QFC pin of bare chip 1 that has been detected as being defective is fixed at a predetermined potential, whereby the input/output of the signal from the data input/output terminal of this bare chip 1 is disabled so as to prevent the above described problem from arising.

Here, a QFC pin has a structure wherein it is exposed to the outside of mold resin 8 and, therefore, it is possible to fix the QFC pin at a predetermined potential from the outside even after bare chip 1 has been covered with mold resin 8.

In addition, the internal circuit configuration of bare chip 1 is a circuit configuration wherein an electrical signal is not inputted/outputted through the data input/output terminal of bare chip 1 when the potential of the QFC pin is fixed at a predetermined potential.

Figure 8:
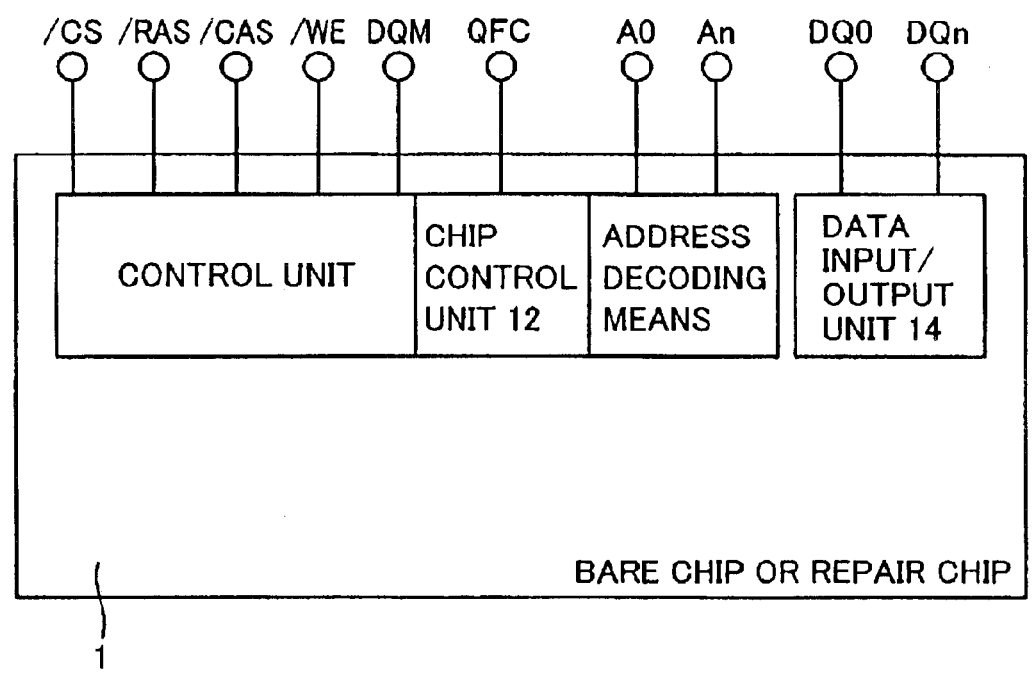
FIG. 8 is a diagram for describing an internal configuration of a semiconductor memory device (bare chip or repair chip)

As shown in FIG. 6, in the case that the QFC pins are OPEN, for example, bare chips 1 (D0 to D7) or repair chips 3 (D'0 to D'7) output electrical signals to data input/output terminals DQ0 to DQ63 from an input/output means 14 shown in FIG. 8 or input electrical signals to input/output means 14 shown in FIG. 8 from data input/output terminals DQ0 to DQ63 according to the operation of chip control means 12 shown in FIG. 8.

In the case that QFC pins are fixed at the ground potential (GND), bare chips 1 (D0 to D7) or repair chips 3 (D'0 to D'7) stop inputting signals from data input/output terminals DQ or stop outputting signals from data input/output terminals DQ using input/output means 14 shown in FIG. 8.

Accordingly, in the case that a bare chip 1 has not been detected as being defected, it is not necessary to mount a repair chip 3 (D'0 to D'7) and it becomes possible to implement a semiconductor memory module wherein a plurality of bare chips 1 are directly mounted on module substrate 2.

In addition, a QFC pin, which is not utilized at the time of the actual operation in a bare chip 1 (D0 to D7), is normally controlled to be OPEN by means of chip control means 12 at the time of the operation of the semiconductor memory module so that a signal is outputted from bare chip 1 (D0 to D7) to data input/output terminal DQ0 to DQ63 or a signal is inputted from data input/output terminal DQ0 to DQ63 to bare chip 1 (DQ).

Furthermore, in the case that there is a bare chip 1 that has been detected as being defective from among bare chips 1 (D0 to D7) in the semiconductor memory module, a repair chip 3 (D'0 to D'7) is mounted on the rear surface of module substrate 2 opposite to the surface on which bare chips 1 are provided and the QFC pin of bare chip 1 (D0) is fixed at the ground potential (GND). Thereby, bare chip 1 (D0) stops outputting a signal to data input/output terminal DQ0 to DQ7 or stops inputting a signal from data input/output terminal DQ0 to DQ7.

Thereby, repair chip 3 (D'0) outputs an electrical signal to data input/output terminal DQ0 to DQ7 or an electrical signal is inputted from data input/output terminal DQ0 to DQ7. Accordingly, the functions of the defective bare chip 1 are substituted for by repair chip 3 so that the semiconductor memory module can be repaired.

Here, though an example of a semiconductor memory module according to the present embodiments is shown wherein bare chips 1 are mounted on one surface (front surface) of module substrate 2 and a repair chip 3 is mounted on the other surface (rear surface), both bare chips as well as repair chips may be mounted on only one surface of a module substrate, while chips are not mounted on the other surface in the case that a module substrate of a large size is available.

Figure 9:
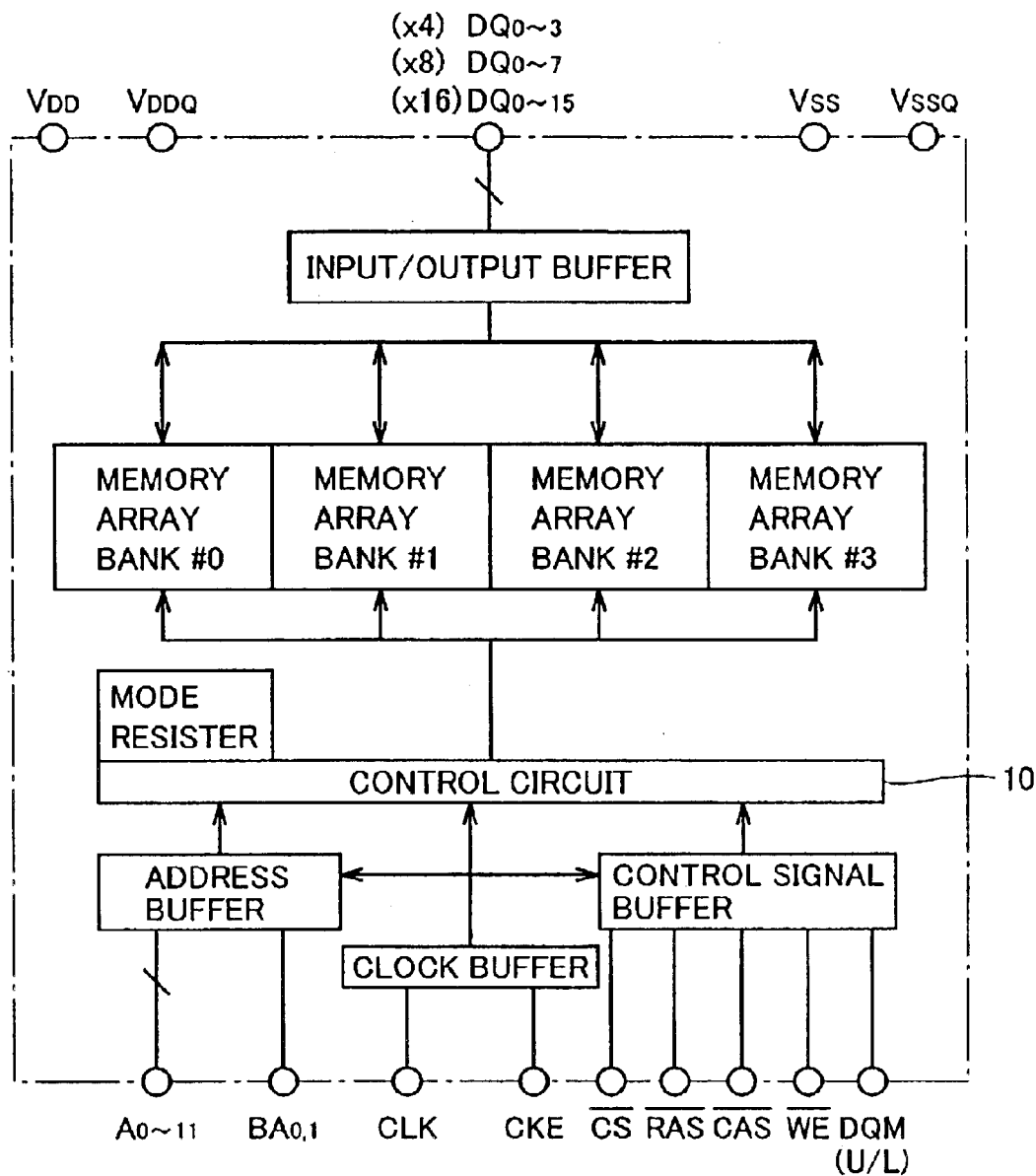
FIG. 9 is a diagram for describing an internal configuration of a semiconductor chip of a first embodiment.

As shown in FIG. 9, bare chips 1 and repair chips 3, respectively, used in the semiconductor memory module of the present embodiment are provided with data input/output terminals DQ0 to DQ15 for carrying out the input/output of data stored in banks and are provided with address signal input terminals $A_0$ to $A_{11}$ to which address signals for designating addresses within banks are inputted.

In addition, bare chips 1 and repair chips 3, respectively, are provided with bank address selection signal input terminals BA0 and BA1 to which a bank address signal, specifying in which bank, from among four banks, data is to be stored, is inputted, are provided with a master clock terminal CLK to which a clock signal is inputted and are provided with a clock enabling terminal CKE to which a clock enabling signal allowing the input of the clock signal is inputted.

In addition, bare chips 1 and repair chips 3, respectively, are provided with a chip selection /CS terminal to which a chip selection signal instructing bare chips 1 and repair chips 3, respectively, to store data is inputted.

In addition, bare chips 1 and repair chips 3, respectively, are provided with a row address strobe terminal/RAS, a column address strobe terminal/CAS and a write enabling terminal/WE. A plurality of types of commands is inputted into a bare chip 1 (repair chip 3) using these three terminals.

In addition, bare chips 1 and repair chips 3, respectively, are provided with an output disabling/write mask terminal DQM (U/L). In addition, bare chips 1 and repair chips 3, respectively, are provided with a power supply terminal $V_{DD}$, a power supply terminal $V_{DDQ}$ for output, a ground terminal $V_{SS}$ and a ground terminal $V_{SSQ}$ for output.

In addition, the insides of bare chips 1 and repair chips 3, respectively, are provided with four memory array banks #0 to #3, a mode register, a control circuit 10 allowing an external signal to be inputted so as to control writing in of data into memory banks based on this external signal, an address buffer to which an address signal is inputted from the address signal input terminal, a control buffer to which control signals (commands) are inputted from a/RAS terminal, a/CAS terminal and a/WE terminal and a clock buffer to which a signal associated with a clock signal is inputted from the CLK terminal or from the CKE terminal.

Next, a system test of semiconductor memory module carried out before repair of the above described semiconductor memory module of the present embodiment is described.

Figure 10:
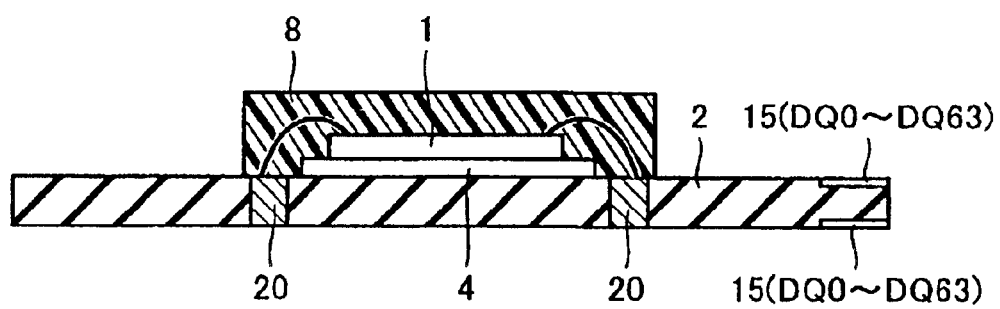
FIG. 10 is a cross sectional structure diagram of a semiconductor memory module of the first embodiment.

FIG. 10 shows the structure of the semiconductor memory module in the condition in which the chip for repair has been removed from the structure after repair shown in FIG. 3. The semiconductor memory module of the present embodiment has the structure as shown in FIG. 10 in the case that all of the bare chips 1 are normally functioning so that it is not necessary to provide a repair chip 3. Accordingly, the cross sectional structure after a plurality of bare chips are integrally molded in mold resin 8 is the structure as shown in FIG. 10.

Figure 11:
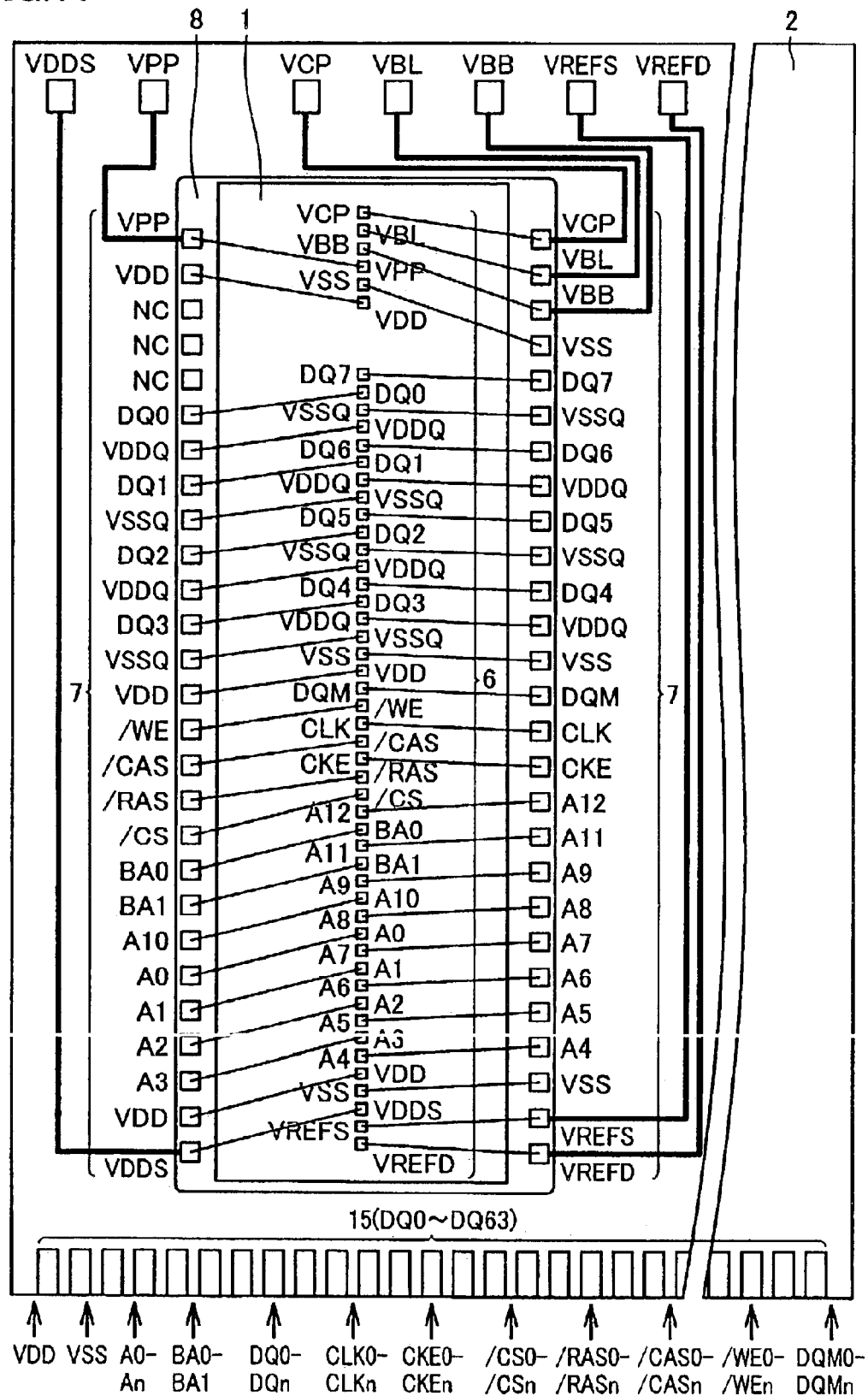
FIG. 11 is a diagram for describing connection relationships between chip pads of a bare chip and substrate pads on the module substrate in the semiconductor memory module of the first embodiment.

In addition, FIG. 11 shows the connection relationship between chip pads 6 of bare chips 1 mounted on module substrate 2 and substrate pads 7 provided on module substrate 2.

As is seen by comparing FIG. 11 to FIG. 27, the semiconductor memory module of the present embodiment and the semiconductor memory module according to the prior art have approximately the same connection relationship between chip pads 6 of bare chips 1 mounted on module substrate 2 and substrate pads 7 provided on module substrate 2.

The semiconductor memory module of the present embodiment, however, is provided with substrate pads VREFD, VREFS, VCP, VBL and VBB outside of mold resin 8 on the surface of module substrate 2 in addition to the configuration of the semiconductor memory module according to the prior art.

These substrate pads VREFD, VREFS, VCP, VBL and VBB, respectively, are connected to chip pads VREFD, VREFS, VCP, VBL and VBB, respectively, by means of electrical wires.

Chip pads VREFD, VREFS, VCP, VBL and VBB, respectively, are connected to a word line driving voltage generation circuit 52, to a sense amplifier power supply voltage VDDS generation circuit 54, to an internal circuit 63, to an internal circuit 64 and to an internal circuit 65, respectively, by means of electrical wires.

Accordingly, no other circuits are connected between substrate pads VREFD, VREFS, VCP, VBL and VBB, respectively, and word line driving voltage generation circuit 52, sense amplifier power supply voltage VDDS generation circuit 54, internal circuit 63, internal circuit 64 and internal circuit 65, respectively.

That is to say, substrate pads VREFD, VREFS, VCP, VBL and VBB, respectively, are electrically connected to word line driving voltage generation circuit 52, sense amplifier power supply voltage VDDS generation circuit 54, internal circuit 63, internal circuit 64 and internal circuit 65, respectively, solely by means of electrical wires.

Accordingly, in the semiconductor memory module of the present embodiment, the desired voltages are applied to substrate pads VREFD, VREFS, VCP, VBL and VBB, respectively, whereby it becomes possible to force voltages into word line driving voltage generation circuit 52, sense amplifier power supply voltage VDDS generation circuit 54, internal circuits 63, 64 and 65, respectively, not only after a plurality of bare chips 1 have been mounted on module substrate 2 but, also, after the plurality of bare chips 1 are integrally covered with mold resin 8. These substrate pads are pads for voltage application.

Figure 12:
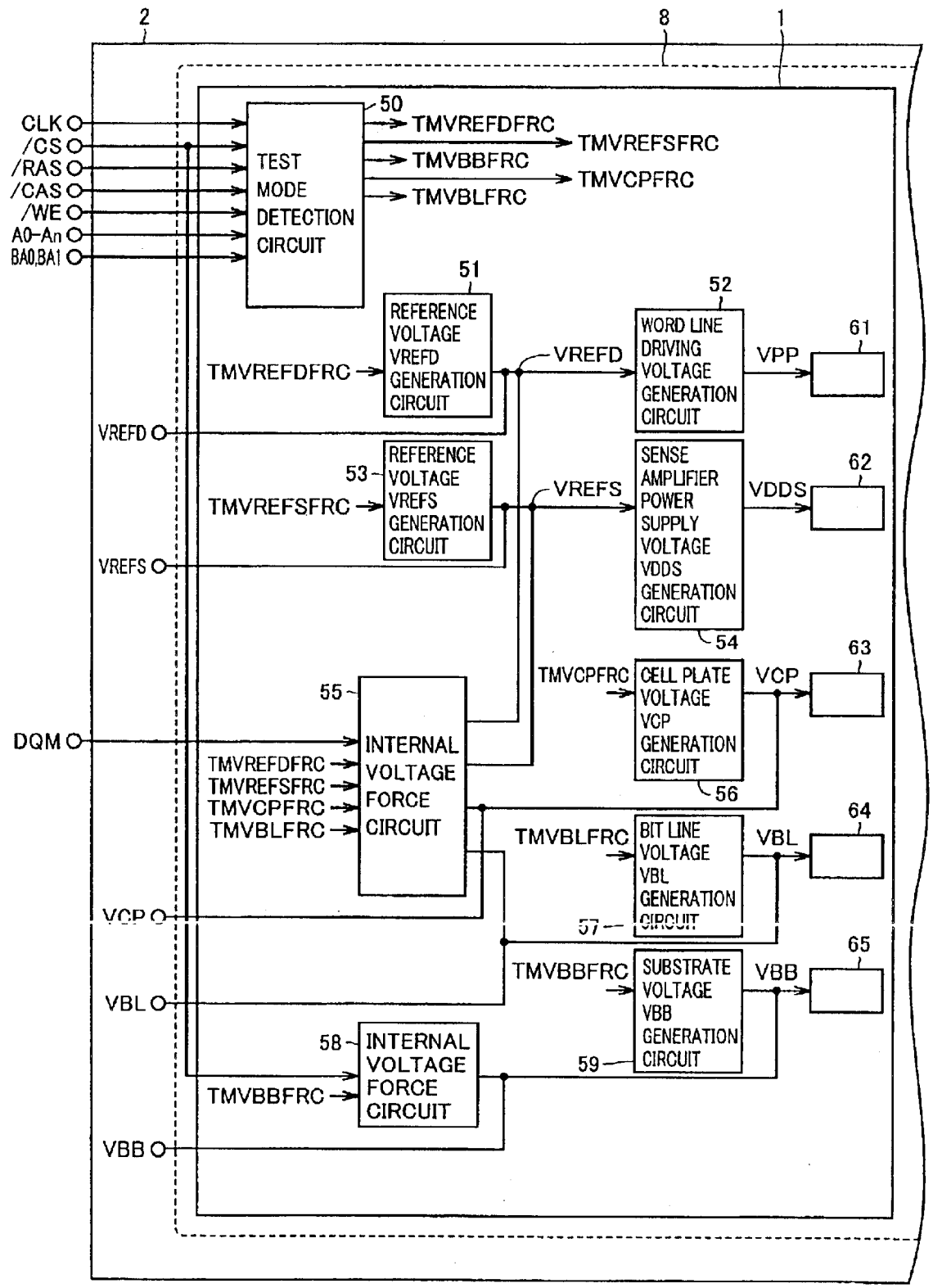
FIG. 12 is a diagram for describing a circuit configuration inside of a bare chip of the semiconductor memory module of the first embodiment.

FIG. 12 is a block diagram showing a circuit configuration provided within one bare chip from among the plurality of bare chips 1 of the semiconductor memory module shown in FIGS. 10 and 11.

Figure 28:
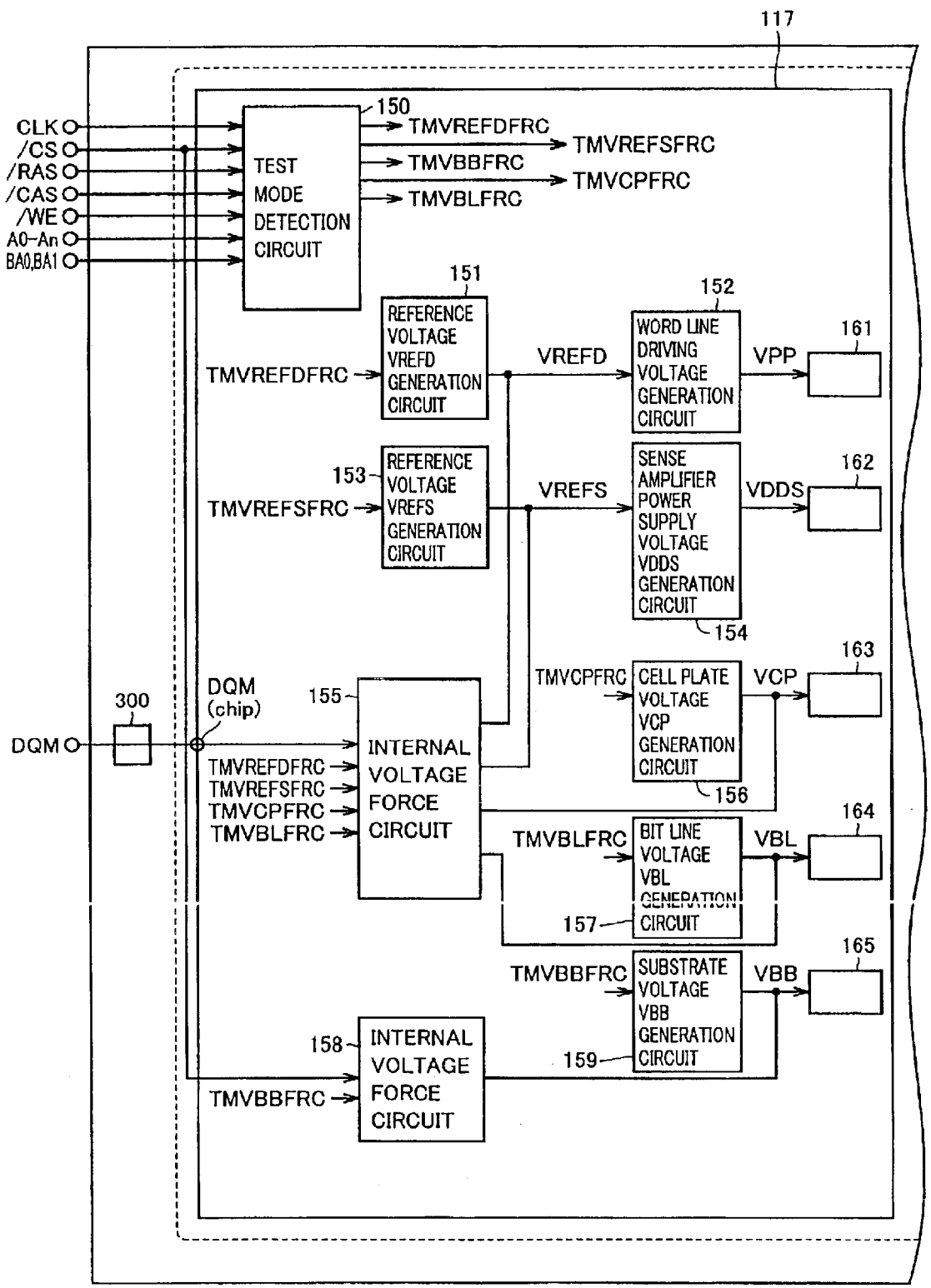
FIG. 28 is a diagram for describing a configuration inside of a bare chip of the semiconductor memory module according to the prior art.

As shown in FIG. 12, bare chip 1 of the semiconductor memory module of the present embodiment has a test mode detection circuit 50 to which a CLK terminal, a chip selection terminal/CS, a row address strobe terminal/RAS, a column address strobe terminal/CAS, a write enabling terminal/WE, address signal input terminals AO to An and bank address selection signal input terminals BA0 and BA1 are connected in the same manner as of semiconductor chip 117 of the semiconductor memory module according to the prior art shown in FIG. 28. The type of test mode is selected in accordance with the type of command inputted to test mode detection circuit 50 from the plurality of terminals connected to this test mode detection circuit 50.

Figure 29:
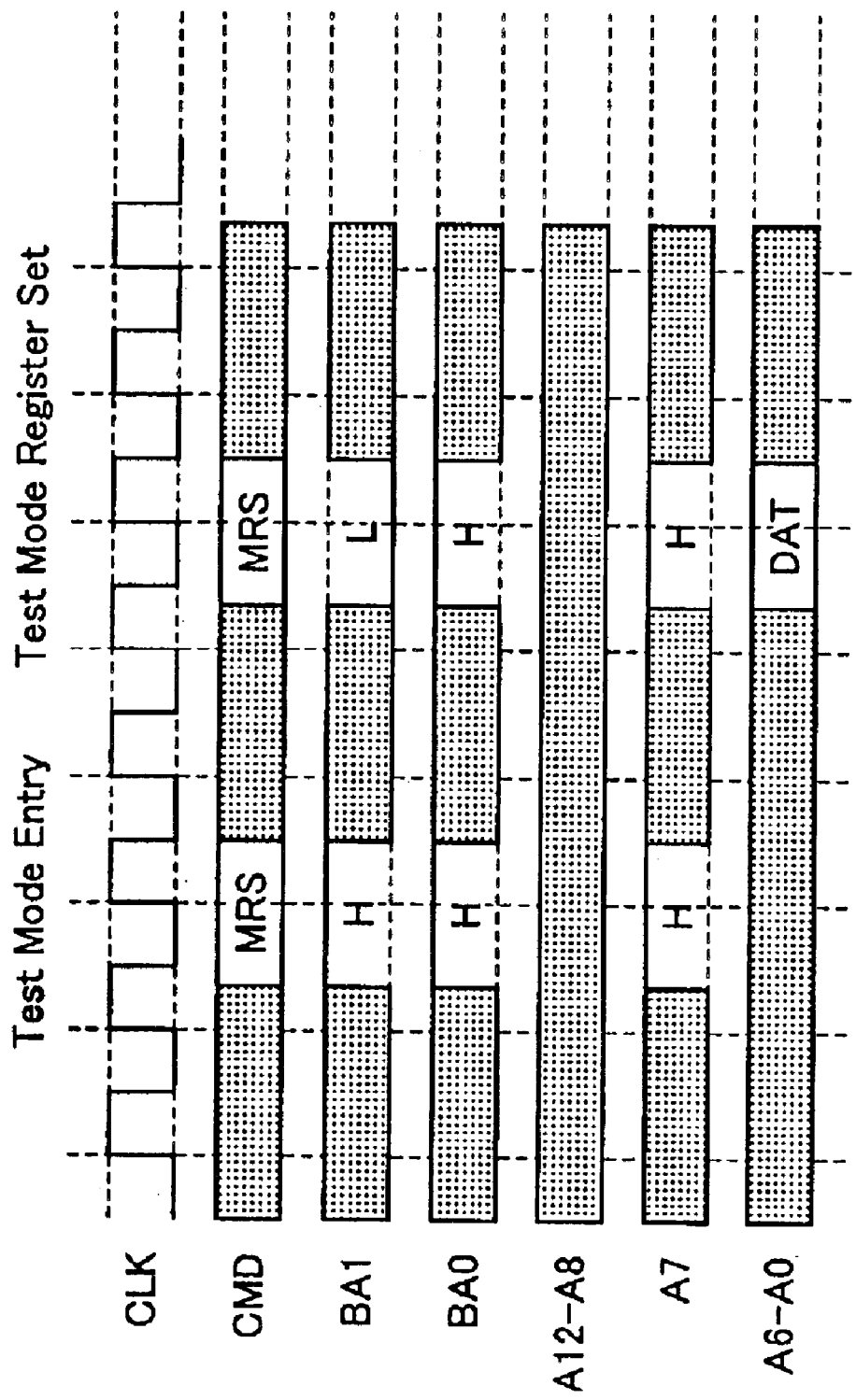
FIG. 29 is a diagram for describing commands inputted according to a test mode of the semiconductor memory module according to the prior art.

As a result, a predetermined signal for conversion to the selected test mode is transmitted to internal voltage force circuits 55 and 58, respectively, from test mode detection circuit 50 in the same manner as for the semiconductor chip according to the prior art described in reference to FIGS. 28 and 29 as well as to Table 1.

In addition, bare chip 1 of the semiconductor memory module of the present embodiment is provided with a reference voltage VREFD generation circuit 51, a word line driving voltage generation circuit 52, a reference voltage VREFS generation circuit 53, a sense amplifier power supply voltage VDDS generation circuit 54, a cell plate voltage VCP generation circuit 56, a bit line voltage VBL generation circuit 57 and a substrate voltage VBB generation circuit 59, which are circuits for applying internal voltages to internal circuits 61 to 65, respectively, in the same manner as of the semiconductor memory module according to the prior art.

Reference voltage VREFD generation circuit 51, word line driving voltage generation circuit 52, reference voltage VREFS generation circuit 53, sense amplifier power supply voltage VDDS generation circuit 54, cell plate voltage VCP generation circuit 56, bit line voltage VBL generation circuit 57 and substrate voltage VBB generation circuit 59 are connected to internal circuits 61, 62, 63, 64 and 65, respectively.

In addition, a voltage generated in reference voltage VREFD generation circuit 51 is applied to word line driving voltage generation circuit 52. In addition, the voltage generated in reference voltage VREFS generation circuit 53 is applied to sense amplifier power supply voltage VDDS generation circuit 54.

In addition, a voltage generated in internal voltage force circuit 55 is applied to word line driving voltage generation circuit 52 and to sense amplifier power supply voltage VDDS generation circuit 54.

In addition, internal voltage force circuit 55 and a node VCP are connected only by means of electrical wires so that the voltage generated in internal voltage force circuit 55 is applied to internal circuit 63 connected to node VCP. In addition, it becomes possible to apply a desired voltage to internal circuit 63 without the intervention of internal voltage force circuit 55 by applying a predetermined voltage to a substrate pad VCP. Furthermore, it becomes possible to monitor the voltage generated by internal voltage force circuit 55, which is the voltage applied to internal circuit 63 connected to node VCP, using substrate pad VCP.

In addition, internal voltage force circuit 55 and node VBL are connected only by means of electrical wires so that the voltage generated in internal voltage force circuit 55 is applied to internal circuit 64 connected to a node VBL. In addition, it becomes possible for internal voltage force circuit 55 to directly apply a voltage to internal circuit 64 connected to bit line voltage VBL generation circuit 57. Furthermore, it becomes possible to monitor the voltage generated by internal voltage force circuit 55, which is the voltage applied to internal circuit 64 connected to node VBL, using substrate pad VBL.

In addition, internal voltage force circuit 58 and node VBB are connected only by means of electrical wires so that the voltage generated in internal voltage force circuit 58 is applied to internal circuit 65 connected to a node VBB. In addition, it becomes possible for internal voltage force circuit 58 to directly apply a voltage to internal circuit 65 connected to substrate voltage VBB generation circuit 59. Furthermore, it becomes possible to monitor the voltage generated by internal voltage force circuit 58, which is the voltage applied to internal circuit 65 connected to node VBB, using substrate pad VBB.

Figure 13:
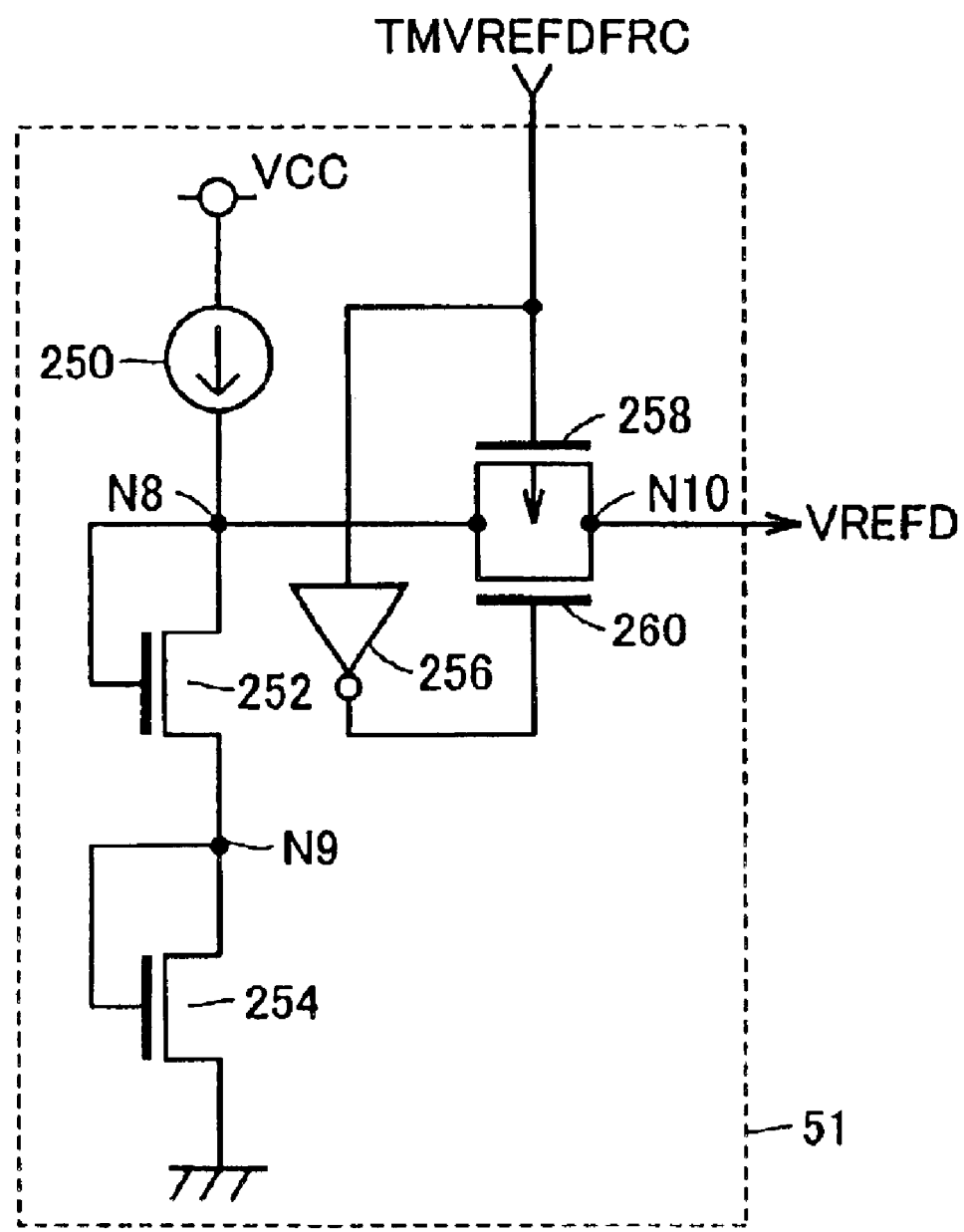
FIG. 13 is a diagram showing a reference voltage VREFD generation circuit inside of a bare chip of the semiconductor memory module of the first embodiment.

FIG. 13 is a circuit diagram showing a configuration of reference voltage VREFD generation circuit 51 in FIG. 12.

In reference to FIG. 13, reference voltage VREFD generation circuit 51 is described. Reference voltage VREFD generation circuit 51 includes: a constant current source 250 connected between the node to which power supply voltage VCC is applied and node N8; an N-channel MOS transistor 252 connected between node N8 and node N9, of which the gate electrode is connected to node N8; and an N-channel MOS transistor 254 connected between node N9 and the ground node, of which the gate electrode is connected to node N9.

Reference voltage VREFD generation circuit 51 further includes: an inverter circuit 256 for receiving and inverting a test mode VREF force indication signal TMVREFDFRC; a P-channel MOS transistor 258 connected between node N8 and node N10, wherein test mode VREFD force indication signal TMVREFDFRC is inputted to the gate electrode; and an N-channel MOS transistor 260 connected between node N8 and node N10, wherein an output signal of inverter circuit 256 is inputted to the gate electrode. When test mode VREFD force indication signal TMVREFDFRC becomes of the L level, the voltage of node N8 is conveyed from node N10 so that the voltage thereof is applied to word line driving voltage generation circuit 52 as reference voltage VREFD.

Figure 14:
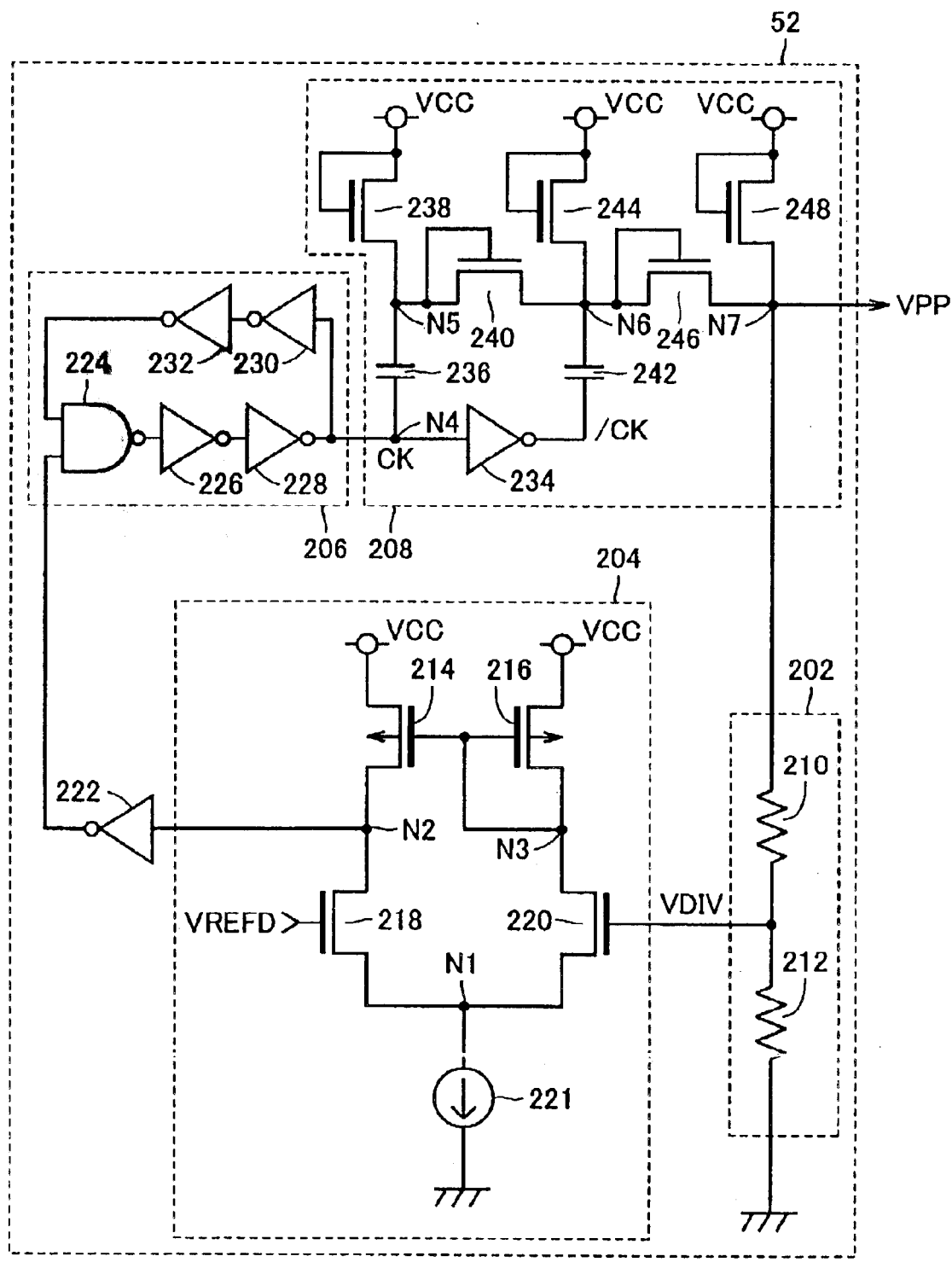
FIG. 14 is a diagram showing a word line driving voltage generation circuit inside of a bare chip of the semiconductor memory module of the first embodiment.

FIG. 14 is a circuit diagram showing the configuration of word line driving voltage generation circuit 52 in FIG. 12.

Word line driving voltage generation circuit 52 is described in reference to FIG. 14. Word line driving voltage generation circuit 52 includes a voltage divider 202, for dividing word line driving voltage VPP so as to apply a divided voltage VDIV, and a comparator 204, for comparing divided voltage VDIV with reference voltage VREFD.

In addition, word line driving voltage generation circuit 52 includes an inverter 222 for inverting the condition of the output signal of comparator 204, an oscillator 206 for starting oscillation of clock signal CK in accordance with the condition of the output signal of inverter 222 and a charge pump circuit 208 for applying word line driving voltage VPP to node 7 in response to clock signal CK.

Divider 202 includes resistors 210 and 212 directly connected between node N7, to which word line driving voltage VPP is applied, and the ground node. Divided voltage VDIV is applied to the connection node to which resistor 210 and resistor 212 are connected.

Comparator 204 is connect between the node, to which power supply voltage VCC is applied, and node N2 and includes a P-channel MOS transistor 214 of which the gate electrode is connected to node N3 and a P-channel MOS transistor 216 of which the source electrode is connected to power supply voltage VCC and of which the gate electrode and the drain electrode are connected to node N3.

Comparator 204 includes: an N-channel MOS transistor 218, connected between node N2 and node N1, wherein reference voltage VREFD is applied to the gate electrode; an N-channel MOS transistor 220, connected between node N3 and node N1, wherein divided voltage VDIV is applied to the gate electrode; and a constant current source 221 connected between node N1 and the ground node.

Oscillator circuit 206 includes a NAND circuit 224, wherein the output signal of inverter 222 is inputted to one input terminal, and an inverter 226 to which the output signal of NAND circuit 224 is inputted.

Oscillator 206 includes an inverter 228 for inverting the output signal of inverter 226 so as to output clock signal CK, an inverter 230 for inverting clock signal CK and an inverter 232 for inverting the output signal of inverter 230. The output signal of inverter 232 is inputted to the other input terminal of NAND circuit 224.

Charge pump circuit 208 includes: an inverter 234 for receiving and inverting clock signal CK so as to output clock signal/CK; a capacitor 236 connected between node N4 to which clock signal CK is inputted and node N5; and an N-channel MOS transistor 238, connected between the node to which power supply voltage VCC is applied and node N5, of which the gate electrode is connected to power supply voltage VCC.

Charge pump circuit 208 further includes: an N-channel MOS transistor 240, connected between node N5 and node N6, of which the gate electrode is connected to node N5; and an N-channel MOS transistor 244, connected between the node to which power supply voltage VCC is applied and node N6, of which the gate is connected to the node to which power supply voltage VCC is applied.

Charge pump circuit 208 includes: an N-channel MOS transistor 246, connected between node N6 and node N7, of which the gate electrode is connected to node N6; and an N-channel MOS transistor 248, connected between the node to which power supply voltage VCC is applied and node N7 to which word line driving voltage VPP is supplied, of which the electrode is connected to the node to which power supply voltage VCC is applied.

In comparator 204, in the case that divided voltage VDIV is lower than reference voltage VREFD, the output level of inverter 222 becomes the H level. Thereby, oscillation circuit 206 is activated.

In addition, charge pump circuit 208 boosts power supply voltage VCC, which is then applied to node 7, in accordance with clock signal CK. When the voltage applied to node 7 becomes sufficiently high, divided voltage VDIV becomes higher than reference voltage VREFD. Thereby, the output level of inverter 222 becomes of the L level. As a result, oscillator 206 stops oscillation and charge pump circuit 208 stops the boosting operation.

Figure 15:
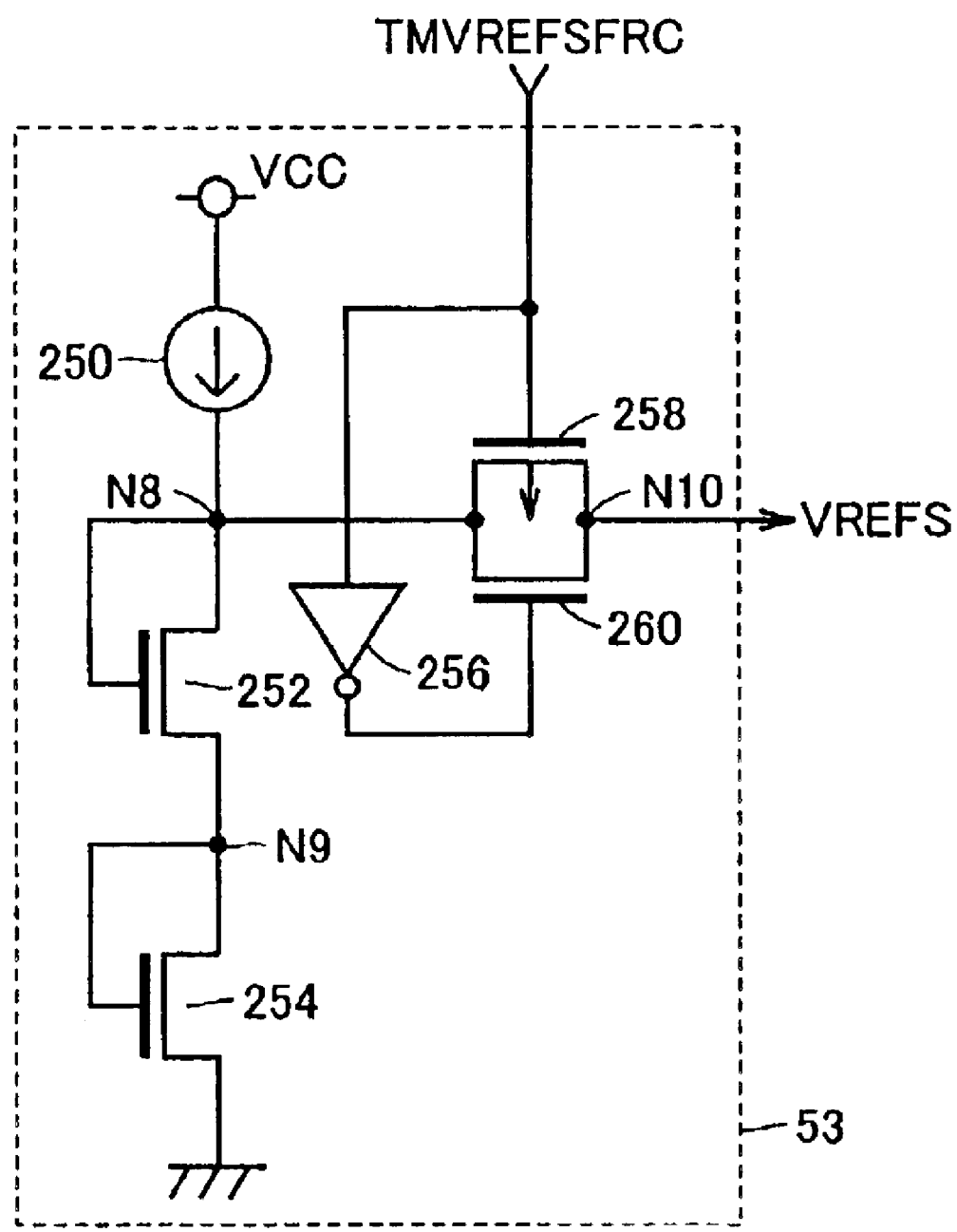
FIG. 15 is a diagram showing a reference voltage VREFS generation circuit inside of a bare chip of the semiconductor memory module of the first embodiment.

FIG. 15 is a circuit diagram showing the configuration of reference voltage VREFS generation circuit 53 in FIG. 12.

Reference voltage VREFS generation circuit 53 is described in reference to FIG. 15. Reference voltage VREFS generation circuit 53 is a circuit for applying reference voltage VREFS to node N10 when test mode VREF force indication signal TMVREFSFRC is at the L level.

Reference voltage VREFS generation circuit 53 differs from reference voltage VREFD generation circuit 51 shown in FIG. 13 in the point that test mode VREFS force indication signal TMVREFSFRC is inputted, in place of test mode VREFD force indication signal TMVREFDFR, to reference voltage VREFS generation circuit 53 and in the point that reference voltage VREFS is applied, in place of reference voltage VREFD, to sense amplifier power supply voltage VDDS circuit 54 in reference voltage VREFS generation circuit 53. However, the internal configuration of reference voltage VREFS generation circuit 53 is the same internal configuration as of reference voltage VREFD generation circuit 51 shown in FIG. 13, of which the descriptions are not repeated.

Figure 16:
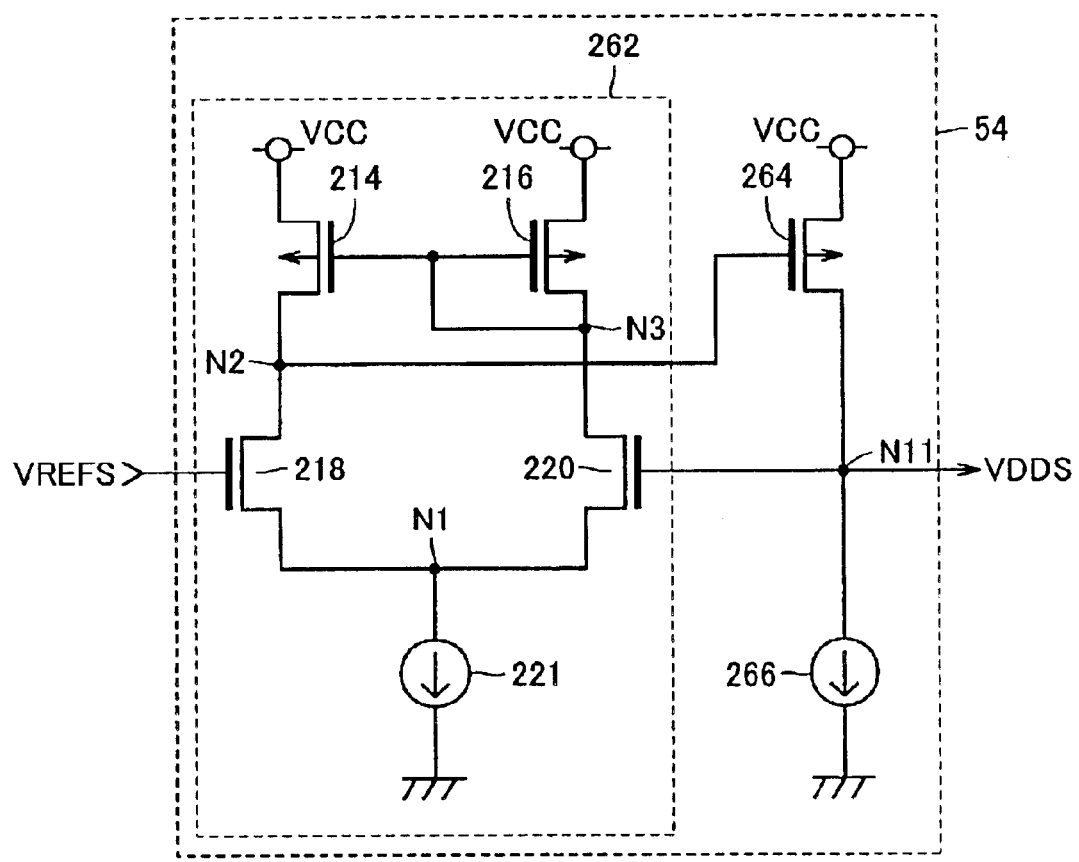
FIG. 16 is a diagram showing a sense amplifier power supply voltage VDDS generation circuit inside of a bare chip of the semiconductor memory module of the first embodiment.

FIG. 16 is a circuit diagram showing the configuration of sense amplifier power supply voltage VDDS generation circuit 54 in FIG. 12.

Sense amplifier power supply voltage VDDS generation circuit 54 is described in reference to FIG. 16. Sense amplifier power supply voltage VDDS generation circuit 54 includes: a comparator 262 for comparing reference voltage VREFS with power supply voltage VDDS; a P-channel MOS transistor 264, connected between the node to which power supply voltage VCC is applied and node N11, wherein the output signal of comparator 262 is inputted to the gate electrode; and a constant current source 266 connected between node N11 and the ground node. Here, power supply voltage VDDS is applied to node 11.

Comparator 262 differs from comparator 204 shown in FIG. 14 in the point that reference voltage VREFS in place of reference voltage VREFD is applied to the gate electrode of N-channel MOS transistor 218 in comparator 262 and in the point that power supply voltage VDDS in place of divided voltage VDIV is applied to the gate electrode of N-channel MOS transistor 220 in comparator 262. However, the internal configuration of comparator 262 is the same as the internal configuration of comparator 204, of which the descriptions are not repeated.

Figure 17:
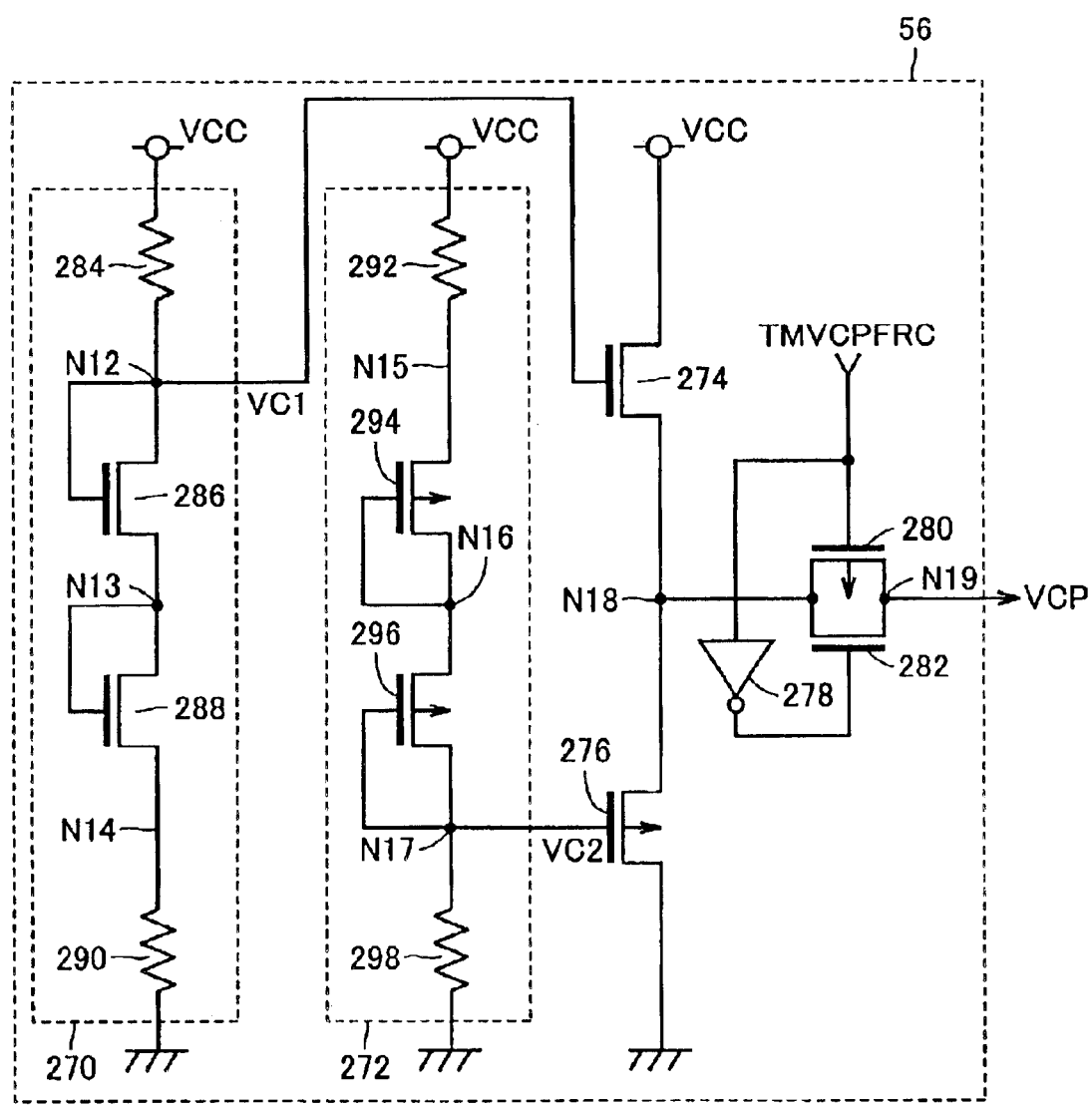
FIG. 17 is a diagram showing a cell plate voltage VCP generation circuit inside of a bare chip of the semiconductor memory module of the first embodiment.

FIG. 17 is a circuit diagram showing the configuration of cell plate voltage VCP generation circuit 56 in FIG. 12.

Cell plate voltage VCP generation circuit 56 is described in reference to FIG. 17. Cell plate voltage VCP generation circuit 56 includes a voltage generation circuit 270 for generating a voltage VC1 and a voltage generation circuit 272 for generating a voltage VC2. Cell plate voltage VCP generation circuit 56 includes: an N-channel MOS transistor 274 connected between power supply voltage VCC and node N18 wherein voltage VC1 is applied to the gate electrode; and a P-channel MOS transistor 276 connected between node N18 and the ground node wherein voltage VC2 is applied to the gate electrode.

Cell plate voltage VCP generation circuit 56 further includes: an inverter 278 for receiving and inverting test mode VCP force indication signal TMVCPFRC; a P-channel MOS transistor 280, connected between node N18 and node N19, wherein test mode VCP force indication signal TMVCPFRC is inputted to the gate electrode; and an N-channel MOS transistor 282, connected between node N18 and node N19, wherein the output signal of inverter circuit 278 is inputted to the gate electrode. Here, cell plate voltage VCP is applied to node N19.

Voltage generation circuit 270 includes a resistor 284 connected between the node to which power supply voltage VCC is applied and node N12 and an N-channel MOS transistor 286 of which the drain electrode and the gate electrode are connected to node N12 and of which the source electrode is connected to node N13.

Voltage generation circuit 270 includes: an N-channel MOS transistor 288 of which the drain electrode and the gate electrode are connected to node N13 and of which the source electrode is connected to node N14; and a resistor 290 connected between node N14 and the ground node. Here, voltage VC1 is applied to node N12.

Voltage generation circuit 272 includes: a resistor 292 connected between the node to which power supply voltage VCC is applied and node N15; and a P-channel MOS transistor 294 of which the source electrode is connected to node N15 and of which the gate electrode and the drain electrode are connected to node N16.

Voltage generation circuit 272 includes: a P-channel MOS transistor 296 of which the source electrode is connected to node N16 and of which the gate electrode and the drain electrode are connected to node N17; and a resistor 298 connected between node N17 and the ground node. Here, voltage VC2 is applied to node N17.

Figure 18:
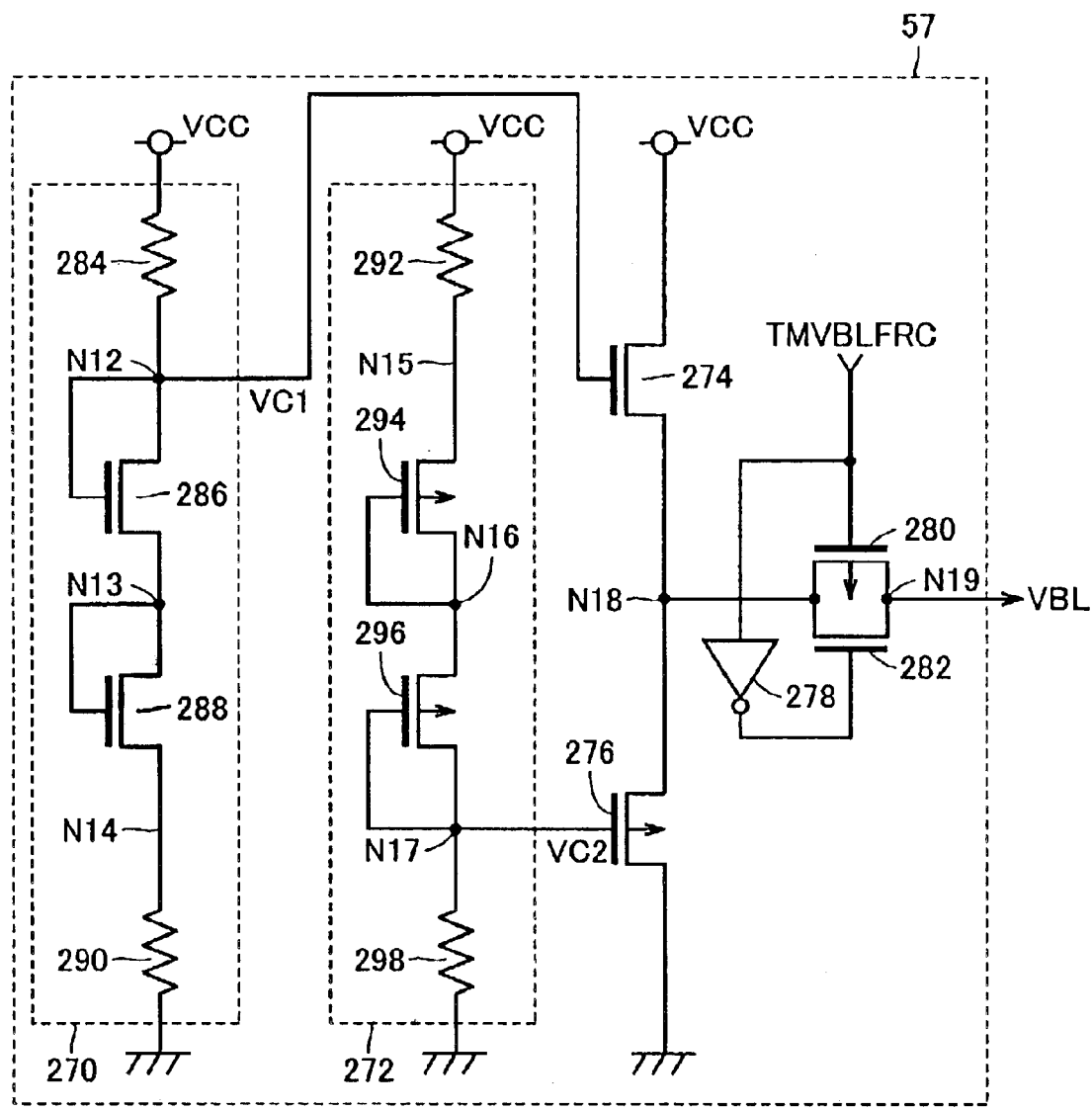
FIG. 18 is a diagram showing a bit line voltage VBL generation circuit inside of a bare chip of the semiconductor memory module of the first embodiment.

FIG. 18 is a circuit diagram showing the configuration of bit line voltage VBL generation circuit 57 in FIG. 12.

Bit line voltage VBL generation circuit 57 is described in reference to FIG. 18. In bit line voltage VBL generation circuit 57, when test mode VBL force indication signal TMVBLFRC becomes of the L level the voltage of node N18 is applied to node N19. Bit line voltage VBL is applied to node N19. Here, the internal configuration of bit line voltage VBL generation circuit 57 is the same as the internal configuration of cell plate voltage VCP generation circuit 56 described in FIG. 17. Accordingly, the same symbols used for cell plate voltage VCP generation circuit 56 described in FIG. 17 are attached to the corresponding parts of bit line voltage VBL generation circuit 57 shown in FIG. 18 and, therefore, descriptions of the corresponding parts are not repeated.

Figure 19:
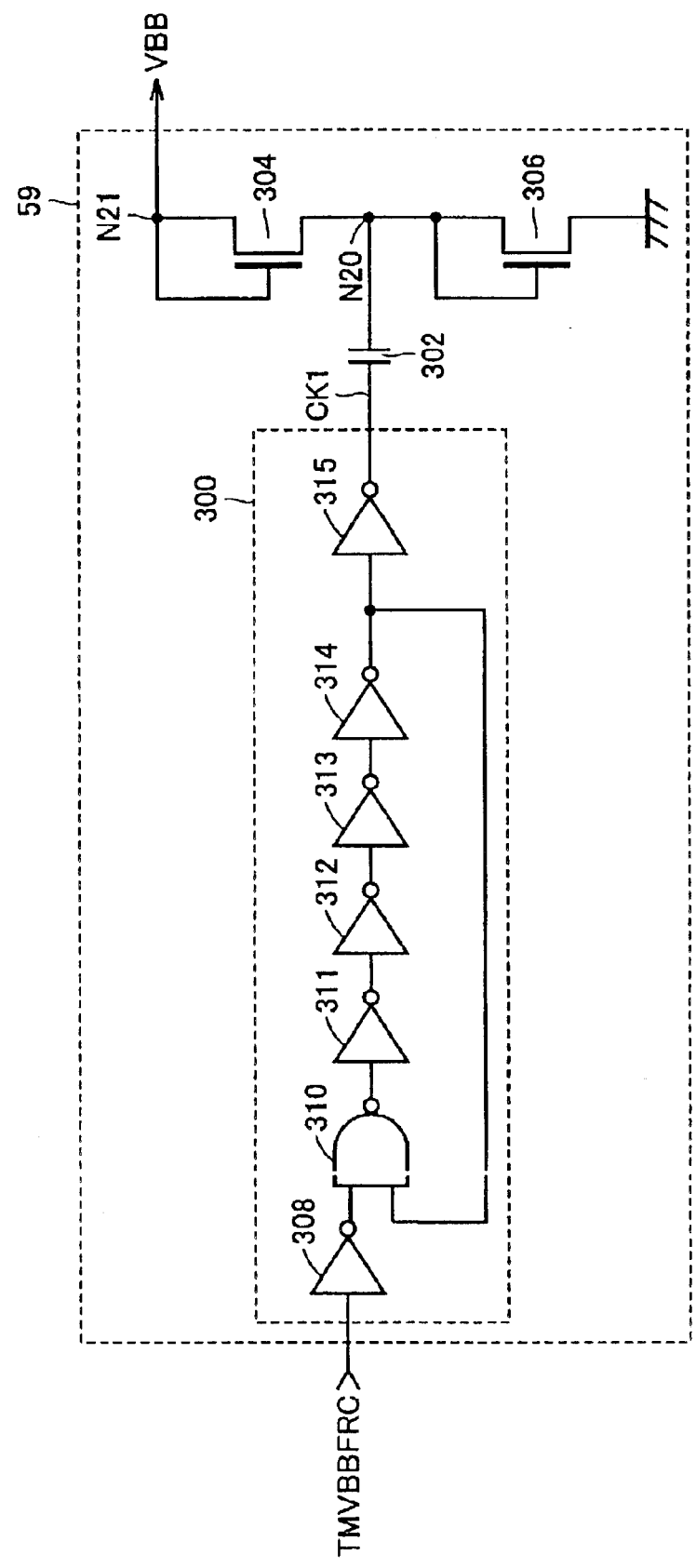
FIG. 19 is a diagram showing a substrate voltage VBB generation circuit inside of a bare chip of the semiconductor memory module of the first embodiment.

FIG. 19 is a circuit diagram showing the configuration of substrate voltage VBB generation circuit 59 in FIG. 12.

Substrate voltage VBB generation circuit 59 is described in reference to FIG. 19. Substrate voltage VBB generation circuit 59 includes an oscillator 300 that is activated in response to test mode VBB force indication signal TMVBBFRC so as to output a clock signal CK1 and a capacitor 302 connected between the output node of oscillator 300 and node N20.

Substrate voltage VBB generation circuit 59 includes: an N-channel MOS transistor 306 of which the gate electrode and the drain electrode are connected to node N20 and of which the source electrode is connected to the ground node; and an N-channel MOS transistor 304, connected between node N21 and node N20, of which the gate electrode is connected to node N21. Here, substrate voltage VBB is applied to node N21.

Oscillator 300 includes: an inverter 308 for receiving and inverting signal TMVBBFRC; a NAND circuit 310 wherein the output signal of inverter 308 is inputted one input terminal; four inverters 311 to 314 connected in series, to which the output signal of NAND circuit 310 is inputted; and an inverter 315 for inverting the output signal of inverter 314 and for outputting clock signal CK1. The output signal of inverter 314 is inputted to the other input terminal of NAND circuit 310.

In the case that test mode VBB force indication signal TMVBBFRC is of the H level, one input terminal NAND circuit 310 becomes of the L level so that oscillator 300 stops oscillation. On the other hand, in the case that test mode VBB force indication signal TMVBBFRC is of the L level, oscillator 300 starts oscillation so that substrate voltage VBB, which is lower than the ground voltage, is applied to node N21 in response to clock signal CK1.

Figure 20:
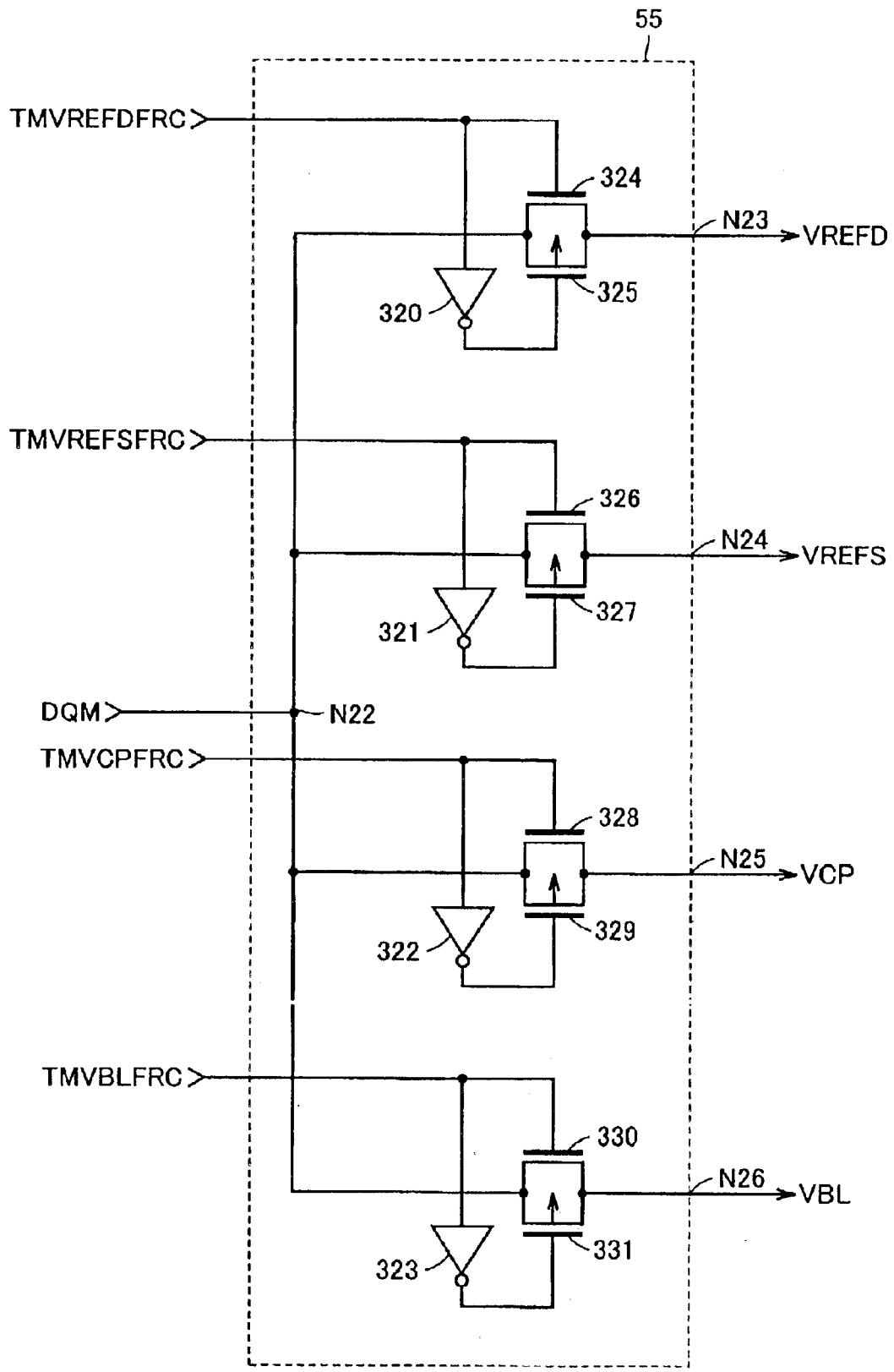
FIG. 20 is a diagram showing one internal voltage force circuit inside of a bare chip of the semiconductor memory module of the first embodiment.

FIG. 20 is a circuit diagram showing the configuration of internal voltage force circuit 55 in FIG. 12.

Internal voltage force circuit 55 is described in reference to FIG. 20. Internal voltage force circuit 55 includes: inverters 320 to 323 for receiving and inverting test mode VREF force indication signal TMVREFDFRC, test mode VRES force indication signal TMVREFSFRC, test mode VCP force indication signal TMVCPFRC and test mode VBL force indication signal TMVBLFRC, respectively; an N-channel MOS transistor 324, connected between node N22 to which a signal that has been inputted to terminal DQM is inputted and node N23, wherein test mode VREF force indication signal TMVREFDFRC is inputted to the gate electrode; and a P-channel MOS transistor 325, connected between node N22 and node N23, wherein the output signal of inverter 320 is inputted to the gate electrode.

Internal voltage force circuit 55 further includes: an N-channel MOS transistor 326, connected between node N22 and node N24, wherein test mode VREF force indication signal TMVREFSFRC is inputted to the gate electrode; and a P-channel MOS transistor 327, connected between node N22 and node N24, wherein the output signal of inverter 321 is inputted to the gate electrode.

Internal voltage force circuit 55 also includes: an N-channel MOS transistor 328, connected between node N22 and node N25, wherein test mode VCP force indication signal TMVCPFRC is inputted to the gate electrode; and a P-channel MOS transistor 329, connected between node N22 and node N25, wherein the output signal of inverter 322 is inputted to the gate electrode.

Internal voltage force circuit 55 includes: an N-channel MOS transistor 330, connected between node N22 and node N26, wherein test mode VBL force indication signal TMVBLFRC is inputted to the gate electrode; and a P-channel MOS transistor 331, connected between node N22 and node N26, wherein the output signal of inverter 323 is inputted to the gate electrode.

Voltages VREFD, VREFS, VCP and VBL are applied to node N23, node N24, node N25 and node N26, respectively.

Figure 21:
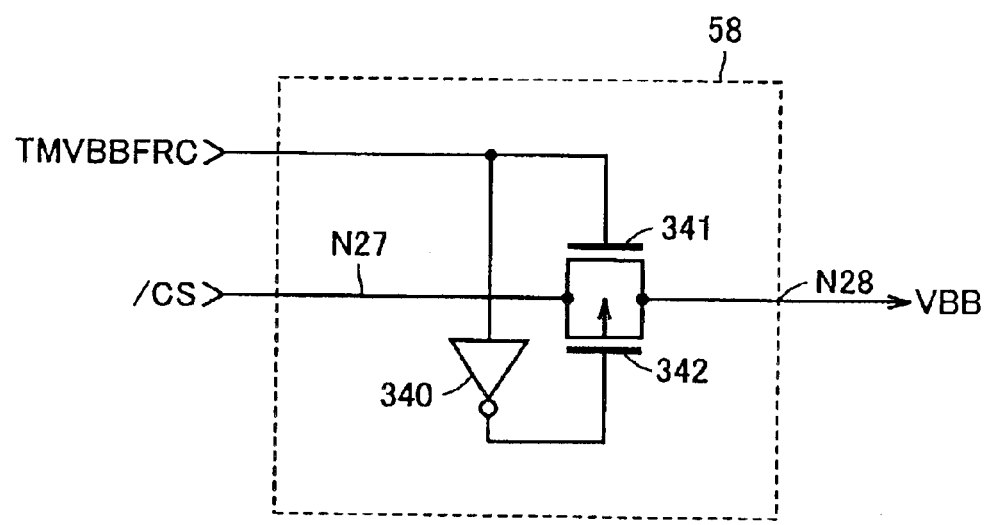
FIG. 21 is a diagram showing the other internal voltage force circuit inside of the bare chip of the semiconductor memory module of the first embodiment.

FIG. 21 is a circuit diagram showing the configuration of internal voltage force circuit 58 in FIG. 12.

Internal voltage force circuit 58 is described in reference to FIG. 21. Internal voltage force circuit 58 includes: an inverter 340 for receiving and inverting test mode VBB force indication signal TMVBBFRC; and an N-channel MOS transistor 341, connected between node N27 to which chip selection signal/CS is inputted and node N28, wherein test mode VBB force indication signal TMVBBFRC is inputted to the gate electrode. In addition, internal voltage force circuit 58 includes a P-channel MOS transistor 342, connected between node N27 and node N28, wherein the output signal of inverter 340 is inputted to the gate electrode.

In the case that test mode VBB force indication signal TMVBBFRC is of the H level, chip selection signal/CS inputted from the outside is transmitted from node N27 to node N28 so that it becomes possible to directly apply substrate voltage VBB to internal circuit 65 from the outside.

Figure 22:
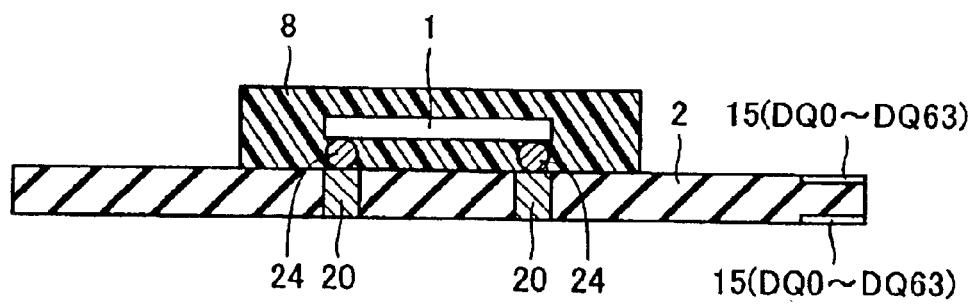
FIG. 22 is a diagram showing a cross sectional structure of a semiconductor memory module of another example of the first embodiment.

Here, though a semiconductor memory module having a structure wherein bare chips 1 are mounted on die pad 4 is shown in FIG. 10, the semiconductor memory module may, as shown in FIG. 22, have a structure provided with a plurality of units, wherein bare chips 1 are mounted on solder balls 24 connected to electrical wires 20, so that the plurality of units is integrally covered with mold resin 8. Here, these solder balls 24 implement the same function as bonding wires 5.

Second Embodiment

Figure 23:
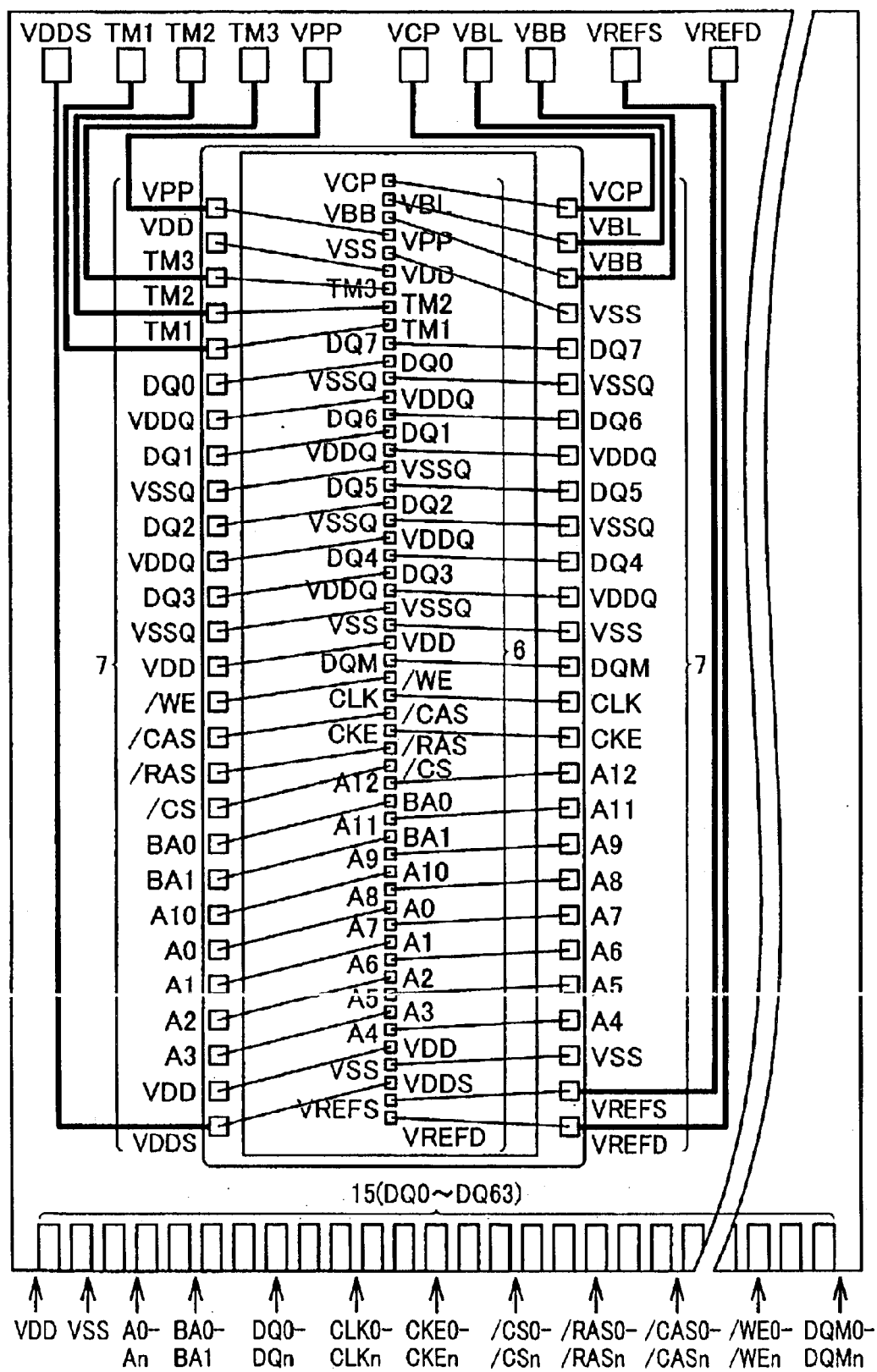
FIG. 23 is a diagram for describing connection relationships between chip pads of a bare chip and substrate pads on the module substrate of a semiconductor memory module of a second embodiment.
Figure 24:
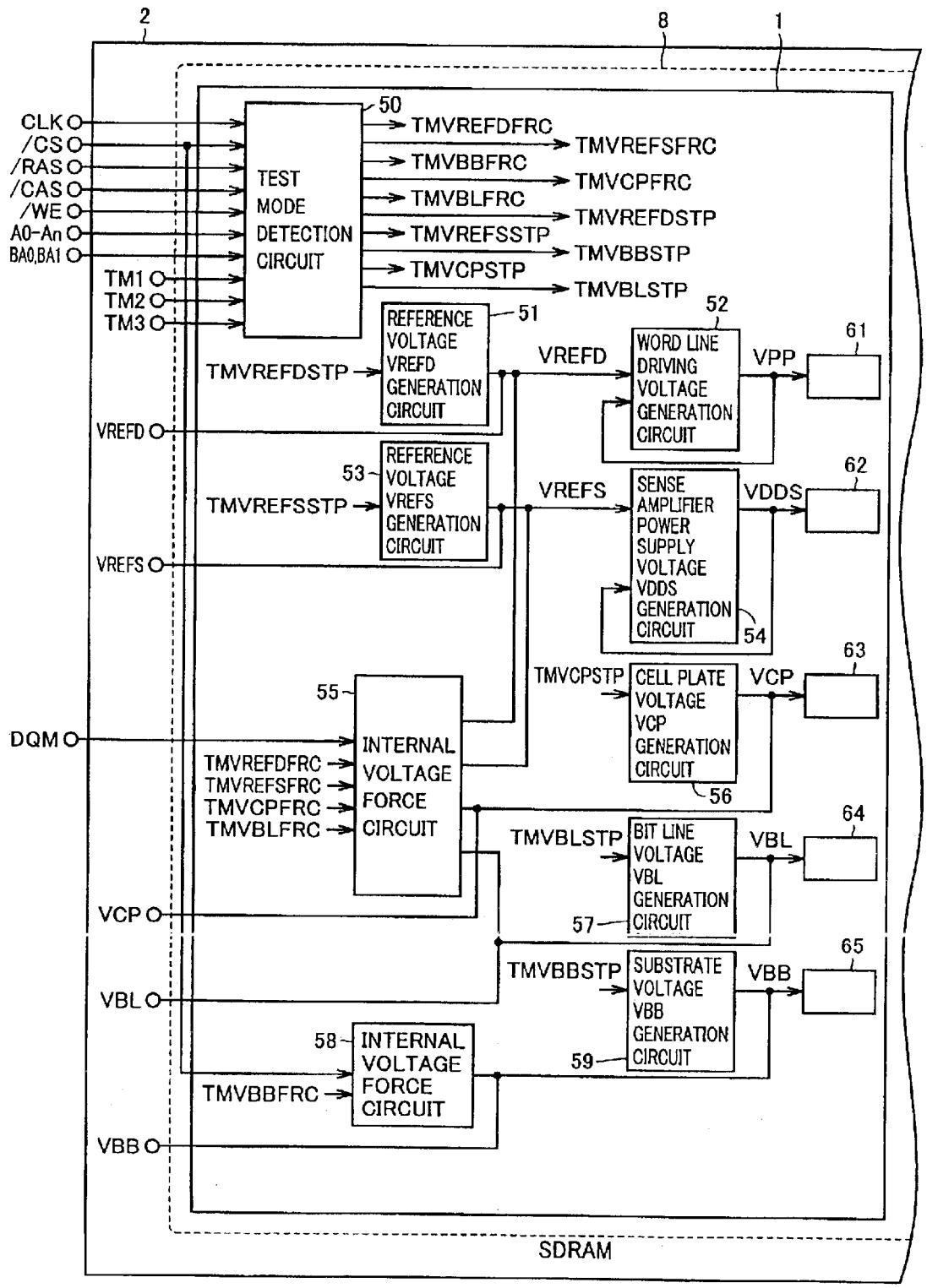
FIG. 24 is a diagram for describing a configuration of an internal circuit of a bare chip of the semiconductor memory module of the second embodiment.
Figure 25:
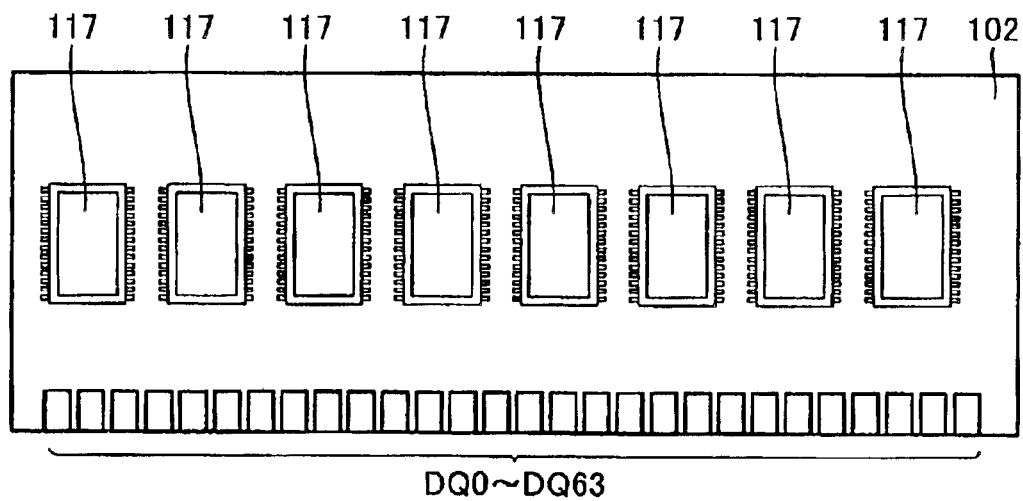
FIG. 25 is a diagram for describing a configuration of a semiconductor memory module, viewed from above, according to a prior art.
Figure 26:
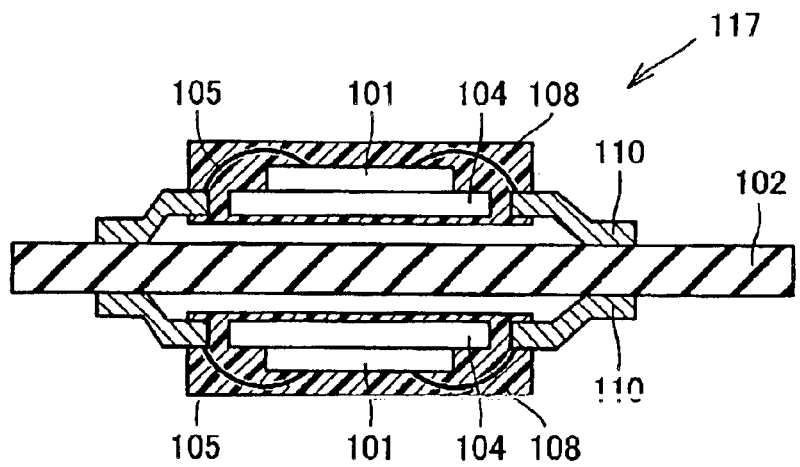
FIG. 26 is a diagram for describing a cross sectional structure of the semiconductor memory module according to the prior art.
Figure 27:
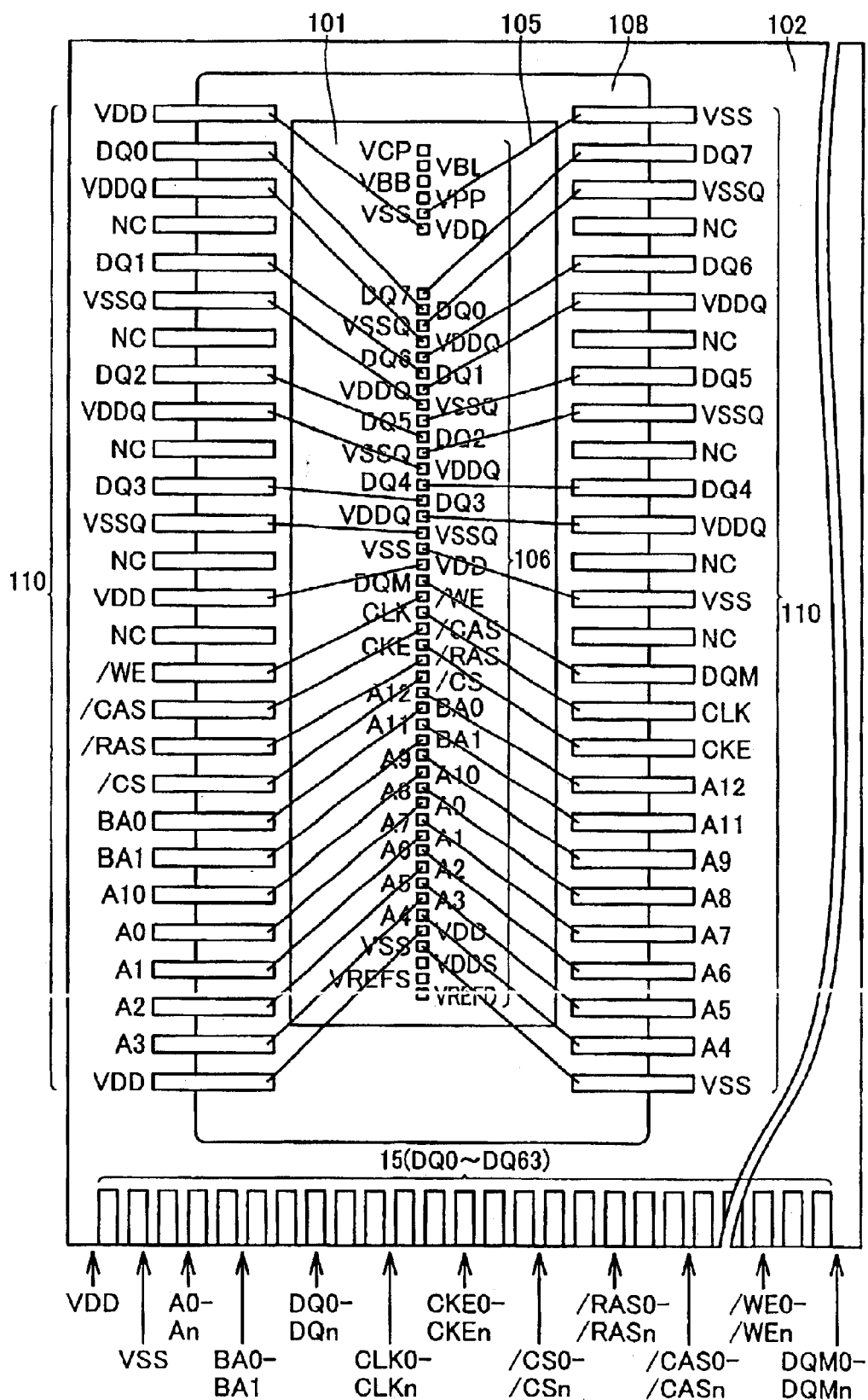
FIG. 27 is a diagram for describing connection relationships between chip pads of a bare chip and a lead frame (pins) of the semiconductor memory module according to the prior art.

Next, a semiconductor memory module of a second embodiment is described in reference to FIGS. 23 and 24. The semiconductor memory module of the second embodiment has almost the same structure as the semiconductor memory module of the first embodiment. In the following, only the parts of the semiconductor memory module of the second embodiment that differ from those of the semiconductor memory module of the first embodiment are described.

The semiconductor memory module of the second embodiment, in addition to the configuration of semiconductor memory module of the first embodiment, is further provided with pads TM1, TM2 and TM3 for command input, to which predetermined commands are inputted in order for entry into test modes, on module substrate 2, as shown in FIG. 23. In addition, TM1, TM2 and TM3 for command input are connected to chip pads TM1, TM2 and TM3 provided on bare chips 1 solely by means of electrical wires.

In addition, as shown in FIG. 24, chip pads TM1, TM2 and TM3 are connected to test mode detection circuit 50 solely by means of electrical wires. Accordingly, commands inputted to pads TM1, TM2 and TM3 for command input are inputted to test mode detection circuit 50. Here, no other circuits are connected between pads TM1, TM2 and TM3 for command input and test mode detection circuit 50. In addition, when the semiconductor memory module is utilized, no control signals are inputted to pads TM1, TM2 and TM3 for command input, respectively, and no control signals are outputted from pads TM1, TM2 and TM3 for command input, respectively.

In bare chip 1 of the semiconductor memory module of the present embodiment it is possible to enter into a test mode wherein individual internal voltages are forced in accordance with the combinations of MRS commands shown in Table 1 and the commands inputted to bank address selection signal input terminals BA0, BA1 and address signal input terminals A0 to A12 in the same manner as in single chip 117 of the semiconductor memory module according to the prior art and as in bare chip 1 of the semiconductor memory module of the first embodiment.

Furthermore, in the semiconductor memory module of the present embodiment it has become possible to enter a test mode wherein individual internal voltages are forced by outputting a variety of test mode signals indicating entry into the individual test modes shown in Table 3 in accordance with combinations of MRS commands shown in Table 2 and the commands inputted to pads TM1, TM2 and TM3 for command input.

TABLE 2

| TITLE OF TEST MODE | COMMAND | TM1 | TM2 | TM3 |
|---|---|---|---|---|
| VREFD FORCE MODE | MRS | L | L | H |
| VREFS FORCE MODE | MRS | L | H | L |
| VCP FORCE MODE | MRS | L | H | H |
| VBL FORCE MODE | MRS | H | L | L |
| VBB FORCE MODE | MRS | H | L | H |

TABLE 3

| TITLE OF TEST MODE | TMVREFDFRC | TMVREFSFRC | TMVCPFRC | TMVBLFRC | TMVBBFRC |
|---|---|---|---|---|---|
| VREFD FORCE MODE | H | L | L | L | L |
| VREFS FORCE MODE | L | H | L | L | L |
| VCP FORCE MODE | L | L | H | L | L |
| VBL FORCE MODE | L | L | L | H | L |
| VBB FORCE MODE | L | L | L | L | H |

In the above described semiconductor memory module of the present embodiment, substrate pads VREFD, VREFS, VCP, VBL and VBB are provided on module substrate 2 outside of mold resin 8 as voltage application pads in the same manner as in the semiconductor memory module of the first embodiment. Therefore, even in the case that a voltage cannot be forced via terminal DQM or chip selection terminal/CS, the desired voltages can be applied to word line driving voltage generation circuit 52, to sense amplifier power supply voltage VDDP generation circuit 54 and to internal circuits 62, 63 and 64 from the outside of bare chip 1.

Furthermore, pads TM1, TM2 and TM3 for command input are provided outside of mold resin 8 on module substrate 2 as dedicated terminals for input of test commands. Therefore, the semiconductor memory module of the present embodiment can easily be made to enter into a test mode for system tests after bare chips 1 have been mounted on module substrate as well as after the plurality of bare chips 1 has been integrally covered with mold resin 8.

Here, the parts having the same symbols in the drawings are parts made of the same material and having the same functions as the above described semiconductor memory modules of the first and second embodiments.

In addition, the parts having symbols of which the last two digits are the same in the drawings are the same parts, having the same functions, as in the semiconductor memory module of the first and second embodiments as well as in the semiconductor memory module according to the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory module having a plurality of units mounted on a module substrate, the plurality of units including:
   a semiconductor chip having an internal voltage generation circuit for internally generating a voltage utilized in an internal circuit; and
   a voltage application terminal electrically connected to said internal circuit, and capable of applying a desired voltage to said internal circuit using a device for voltage application located outside of said semiconductor chip, wherein
   said internal voltage generation circuit and said voltage application terminal are electrically connected to each other by a conductive member.

2. The semiconductor memory module according to claim 1, wherein
   said semiconductor chip is a bare chip,
   a plurality of bare chips mounted on said module substrate are integrally covered with a mold resin together with a main surface of said module substrate, and
   said voltage application terminal is provided outside of said mold resin.

3. A semiconductor memory module having a plurality of units mounted on a module substrate, the plurality of units including:
   an internal voltage generation circuit, provided inside of a semiconductor chip, for internally generating a voltage utilized in an internal circuit of the semiconductor chip;
   a terminal for command input, provided outside of said semiconductor chip, to which a test mode command is inputted for indicating that a test is to be carried out on said semiconductor chip in the semiconductor memory module;
   a test mode detection circuit, provided inside of said semiconductor chip, for outputting a test mode indication signal in the case that said test mode command is inputted to said command input terminal; and
   an internal voltage force circuit, provided inside of said semiconductor chip, for applying a voltage to said internal circuit when said test mode indication signal, outputted by said test mode detection circuit, is inputted.

4. The semiconductor memory module according to claim 3, wherein
   said semiconductor chip is a bare chip,
   a plurality of bare chips mounted on said module substrate is integrally covered with a mold resin together with a main surface of said module substrate and
   said command input terminal is provided outside of said mold resin.

* * * * *